(12) United States Patent
Her et al.

(10) Patent No.: US 10,037,817 B2
(45) Date of Patent: Jul. 31, 2018

(54) SEMICONDUCTOR MEMORY DEVICES AND MEMORY SYSTEMS INCLUDING THE SAME

(71) Applicant: Samsung Electronics Co., Ltd., Suwon-si, Gyeonggi-do (KR)

(72) Inventors: Sung-Jun Her, Hwaseong-si (KR); Dong-Wook Kim, Hwaseong-si (KR); Dong-Hak Shin, Hwaseong-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 171 days.

(21) Appl. No.: 14/958,149

(22) Filed: Dec. 3, 2015

(65) Prior Publication Data

US 2016/0172057 A1    Jun. 16, 2016

(30) Foreign Application Priority Data

Dec. 12, 2014 (KR) ........................ 10-2014-0179331

(51) Int. Cl.
*G11C 29/38* (2006.01)
*G11C 29/44* (2006.01)
*G11C 29/00* (2006.01)
*G11C 29/40* (2006.01)
*G11C 11/401* (2006.01)

(52) U.S. Cl.
CPC .............. *G11C 29/38* (2013.01); *G11C 29/40* (2013.01); *G11C 29/44* (2013.01); *G11C 29/4401* (2013.01); *G11C 29/785* (2013.01); *G11C 11/401* (2013.01)

(58) Field of Classification Search
CPC ......... G11C 29/38; G11C 29/40; G11C 29/44; G11C 11/401; G11C 29/4401; G11C 29/785
USPC .... 714/718, 710, 711, 719, 30, 48; 365/200, 365/201, 189.07, 185.11
See application file for complete search history.

(56) References Cited

U.S. PATENT DOCUMENTS 4,369,511 A * 1/1983 Kimura .................. G11C 29/56
714/719
4,414,665 A * 11/1983 Kimura .................. G11C 29/56
365/201
5,270,982 A * 12/1993 Watanabe ............. G11C 11/406
365/201
5,524,115 A 6/1996 Kim
(Continued)

FOREIGN PATENT DOCUMENTS

KR    1993-0014622 A    7/1993
KR    10-0986551 B1    10/2010
(Continued)

*Primary Examiner* — John J Tabone, Jr.
(74) *Attorney, Agent, or Firm* — Harness, Dickey & Pierce, P.L.C.

(57) ABSTRACT

A semiconductor memory device includes a memory cell array including a plurality of memory cell rows; and a data control circuit configured to, sequentially read a first unit of data from N memory cell rows of the plurality of memory cell rows, generate merged test results by comparing bits read from the first units of the N memory cell rows, and output the merged test results, during the test mode of the semiconductor memory device. Therefore, test time for testing the semiconductor memory device may be greatly reduced because a test device may determine pass/fail of the data of the unit of repair unit on one read operation.

17 Claims, 20 Drawing Sheets

(56) References Cited

U.S. PATENT DOCUMENTS

| | | | |
|---|---|---|---|
| 6,188,610 B1* | 2/2001 | Kakizoe | G11C 16/3418 365/185.22 |
| 6,240,032 B1* | 5/2001 | Fukumoto | G11C 11/5621 365/185.11 |
| 7,106,650 B2 | 9/2006 | Choi | |
| 7,379,357 B2 | 5/2008 | Kang | |
| 7,487,414 B2* | 2/2009 | Lee | G11C 29/40 714/30 |
| 7,546,491 B2 | 6/2009 | Suh et al. | |
| 7,558,934 B2 | 7/2009 | Kondo et al. | |
| 7,719,897 B2 | 5/2010 | Lee et al. | |
| 8,195,882 B2 | 6/2012 | DeLaurier et al. | |
| 8,751,885 B2* | 6/2014 | You | G11C 29/4401 714/718 |
| 9,202,591 B2* | 12/2015 | Solhusvik | G11C 29/08 |
| 2003/0167386 A1* | 9/2003 | Kuo | G06F 13/1631 711/220 |
| 2004/0109370 A1* | 6/2004 | Gappisch | G11C 29/20 365/201 |
| 2007/0070734 A1 | 3/2007 | Hsu et al. | |
| 2010/0306460 A1* | 12/2010 | Hara | G06F 13/1673 711/105 |
| 2011/0235388 A1* | 9/2011 | Nakano | G11C 17/146 365/96 |
| 2012/0120705 A1* | 5/2012 | Mitsubori | G11C 29/025 365/72 |
| 2012/0120748 A1* | 5/2012 | Fujisaki | G11C 29/56008 365/200 |
| 2012/0236916 A1* | 9/2012 | Kobayashi | H04L 27/2662 375/224 |
| 2013/0201767 A1 | 8/2013 | Kim | |
| 2013/0227344 A1 | 8/2013 | Sohn et al. | |
| 2014/0337669 A1* | 11/2014 | Solhusvik | G11C 29/08 714/32 |

FOREIGN PATENT DOCUMENTS

| KR | 20110025175 A | 3/2011 |
|---|---|---|
| KR | 20140050975 A | 4/2014 |

* cited by examiner

FIG. 17

| TR | RST | MTR1 |
|---|---|---|
| H | H | H |
| L | H | L |
| H | L | HOLD |
| L | L | L |

FIG. 18

| TR | LATCH | RST | MTR1 |
|---|---|---|---|
| H | H | L | H |
| H | L | L | L |
| L | H | L | L |
| L | L | L | L |
| X | X | H | TR |

SEMICONDUCTOR MEMORY DEVICES AND MEMORY SYSTEMS INCLUDING THE SAME

CROSS-REFERENCE TO RELATED APPLICATIONS

This US application claims the benefit of priority under 35 USC § 119 to Korean Patent Application No. 10-2014-0179331, filed on Dec. 12, 2014, in the Korean Intellectual Property Office, the contents of which are incorporated herein in their entirety by reference.

BACKGROUND

Example embodiments relate to memory devices, and more particularly to semiconductor memory devices and memory systems including the same.

Semiconductor memory devices may be classified into non-volatile memory devices such as flash memory devices and volatile memory devices such as DRAMs. High speed operation and cost efficiency of DRAMs make it possible for DRAMs to be used for system memories. Due to the continuing shrink in fabrication design rule of DRAMs, bit errors of memory cells in some DRAMs may rapidly increase.

SUMMARY

Some example embodiments may provide a semiconductor memory device capable of reducing test time.

Some example embodiments may provide a memory system including the semiconductor memory device capable of reducing test time.

A semiconductor memory device includes a memory cell array including a plurality of memory cell rows; and a data control circuit configured to, sequentially read a first unit of data from N memory cell rows of the plurality of memory cell rows, (N is an integer equal to or greater than two), generate merged test results by comparing bits read from the first units of the N memory cell rows, and output the merged test results, during the test mode of the semiconductor memory device, wherein the N memory cell rows correspond to a unit of repair of the semiconductor memory device.

The first unit may corresponds to data of a burst length of the semiconductor memory device, the merged test results may include result bits each indicating whether correspondingly-located bits in the first units, read from each of corresponding locations in the N memory cell rows have a same value with respect to each other.

The data control circuit may include a plurality of unit control circuits, and each of the unit control circuits may be configured to sequentially compare correspondingly-located bits in the first units, read from each of corresponding locations in the N memory cell rows, selectively latch a comparison result according to the comparison result, and output each result bit of the merged test results.

Each of the plurality of unit control circuits may include a path selector configured to provide data read from each of the memory cell rows to a first path during a normal mode of the semiconductor memory device and configured to provide the correspondingly-located bits to a second path during the test mode, in response to a mode signal; and a data accumulator configured to sequentially compare the correspondingly-located bits, configured to selectively latch the comparison result, and configured to output each result bit of the merged test results in response to at least a reset signal during the test mode, and the data accumulator may be reset in response to the reset signal whenever the data accumulator outputs a last result bit of the merged test result data for each correspondingly-located bits.

The data control circuit may be configured to write test pattern data with a first logic level in the plurality of memory cell rows during the test mode, and the data accumulator may include a comparator configured to sequentially compare the correspondingly-located bits in response to at least the reset signal; a latch circuit connected to the comparator at a first node, the latch circuit configured to latch an output of the comparator; and a first inverter configured to invert an output of the latch circuit to output a corresponding result bit of the merged test results.

The latch circuit may be configured to output the output of the comparator as the first logic level when the reset signal has a second logic level different from the first logic level and the correspondingly-located bit has the first logic level.

The comparator may include a p-channel metal-oxide semiconductor (PMOS) transistor connected between a power supply voltage and the first node; a first n-channel metal-oxide semiconductor (NMOS) transistor connected to the PMOS transistor at the first node; and a second NMOS transistor connected between the first NMOS transistor and a ground voltage, and wherein comparator may be configured such that the correspondingly-located bits are sequentially received at gates of the PMOS transistor and the first NMOS transistor, and the reset signal is applied to a gate of the second NMOS transistor.

The latch circuit may include an n-channel metal-oxide semiconductor (NMOS) transistor connected between the first node and a ground voltage; and a second inverter connected between the first node and a gate of the NMOS transistor.

The data control circuit may be configured to write test pattern data with a first logic level in the plurality of memory cell rows during the test mode, and the data accumulator may include a NAND gate configured to sequentially receive the correspondingly-located bits as a first input; a latch circuit configured to latch an output of the NAND gate; an inverter configured to invert an output of the latch circuit to output a corresponding result bit of the merged test results; and a switch configured to provide one of an output of the inverter and a power supply voltage as a second input to the NAND gate, in response to the reset signal.

The inverter may be configured to output the corresponding result bit of the merged test results as a second logic level when at least one of the correspondingly-located bit and the output of the latch circuit has the second logic level different from the first logic level.

The memory cell array may include a plurality of first memory blocks and a second memory block, the memory cell rows may be arranged in the first memory blocks and the second memory block, the semiconductor memory device may further include a control logic circuit configured to control access to the memory cell array in response to a command; an address register configured to generate the reset signal in response to an access address; and a plurality of switching circuits coupled to a plurality of first memory cells in the first memory blocks through first bit-lines and coupled to a plurality of second memory cells in the second memory block through second bit-lines, and the memory cell array may be a three dimensional memory cell array.

The control logic circuit may be configured such that, when correspondingly-located bits in the first units, read from each of corresponding locations in the N memory cell rows are not same with respect to each other, the control logic circuit controls the switching circuits such that a first block storing the correspondingly-located bits of the first memory blocks is disconnected and the first block is replaced by a second block of the second memory block.

According to at least some example embodiments of the inventive concepts, a memory system may include a semiconductor memory device; and a test device configured to test the semiconductor memory device, wherein the semiconductor memory device may include a memory cell array including a plurality of memory cell rows, and a data control circuit configured to, sequentially read a first unit of data from N memory cell rows of the plurality of memory cell rows, (N is an integer equal to or greater than two), generate merged test results by comparing bits read from the first units of the N memory cell rows, and output the merged test results, during the test mode of the semiconductor memory device, wherein the N memory cell rows correspond to a unit of repair of the semiconductor memory device.

The first units of data may be test pattern data that are provided from the test device and are written in the memory cell array, the first unit may correspond to data of a burst length of the semiconductor memory device, the merged test results data may include result bits each indicating whether correspondingly-located bits in the first units, read from each of corresponding locations in the N memory cell rows have a same value with respect to each other, and the test device may determine to perform repair operation on the semiconductor memory device by the unit of repair, based on the merged test results.

The test device may be configured to control the semiconductor memory device such that memory cells of the unit of repair are repaired, when the result bits in the merged test results are not same with respect to each other.

According to at least some example embodiments of the inventive concepts, a semiconductor memory device includes a memory cell array including a plurality of memory cells connected to a plurality of word-lines, the plurality of word-lines including at least first and second word-lines; and a data control circuit configured to read a first set of bits from first memory cells connected to the first word-line, read a second set of bits from second memory cells connected to the second word-line, locations of the first memory cells with respect to the first word-line corresponding, respectively, with locations of the second memory cells with respect to the second word-line, such that the first set of bits correspond, respectively, with the second set of bits, perform a comparison operation by determining if values of the first set of bits match corresponding ones of the second set of bits, and determine whether or not a unit of memory cells including the first and second memory cells is a failed unit based on the comparison operation.

The plurality of word-lines may include third and fourth word-lines, and the data control circuit may be further configured to, read a third set of bits from third memory cells connected to the third word-line, read a fourth set of bits from fourth memory cells connected to the fourth word-line, locations of the first memory cells with respect to the first word-line, locations of the second memory cells with respect to the second word-line, locations of the third memory cells with respect to the third word-line, and locations of the fourth memory cells with respect to the fourth word-line corresponding, respectively, to each other such that the first set of bits, second set of bits, third set of bits, and fourth set of bits correspond, respectively, to each other, perform the comparison operation by determining if values of the first set of bits match corresponding ones of the second set of bits, the third set of bits, and the fourth set of bits, and determine whether or not a unit of memory cells including the first, second, third and fourth memory cells is a failed unit based on the comparison operation.

Accordingly, the semiconductor memory device may sequentially read a first unit of data from N memory cell rows of a plurality of memory cell rows (N is an integer equal to or greater than two), respectively, may generate the merged test results by comparing bits read from the first units of the N memory cell rows and may output the merged test results during the test mode. The merged test results may include result bits each indicating whether correspondingly-located bits in the first units, read from each of corresponding locations in the N memory cell rows have a same value with respect to each other. Therefore, test time for testing the semiconductor memory device may be greatly reduced because a test device may determine pass/fail of the data of the unit of repair unit on one read operation.

BRIEF DESCRIPTION OF THE DRAWINGS

The above and other features and advantages of example embodiments of the inventive concepts will become more apparent by describing in detail example embodiments of the inventive concepts with reference to the attached drawings. The accompanying drawings are intended to depict example embodiments of the inventive concepts and should not be interpreted to limit the intended scope of the claims. The accompanying drawings are not to be considered as drawn to scale unless explicitly noted.

FIG. 17 illustrates the corresponding bit, the reset signal and the result bit when the data accumulator of FIG. 10 employs the implementations of FIGS. 13 and 15.

FIG. 18 illustrates the corresponding bit, the reset signal and the result bit when the data accumulator of FIG. 10 employs the implementation of FIG. 16.

DETAILED DESCRIPTION OF THE EMBODIMENTS

Figure 1:
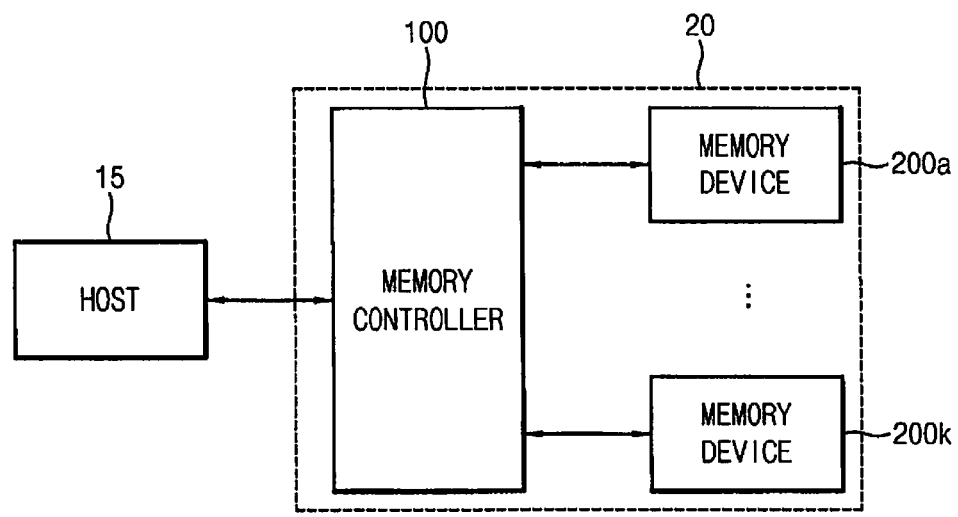
FIG. 1 is a block diagram illustrating an electronic system according to at least some example embodiments of the inventive concepts.

Detailed example embodiments of the inventive concepts are disclosed herein. However, specific structural and functional details disclosed herein are merely representative for purposes of describing example embodiments of the inventive concepts. Example embodiments of the inventive concepts may, however, be embodied in many alternate forms and should not be construed as limited to only the embodiments set forth herein.

Accordingly, while example embodiments of the inventive concepts are capable of various modifications and alternative forms, embodiments thereof are shown by way of example in the drawings and will herein be described in detail. It should be understood, however, that there is no intent to limit example embodiments of the inventive concepts to the particular forms disclosed, but to the contrary, example embodiments of the inventive concepts are to cover all modifications, equivalents, and alternatives falling within the scope of example embodiments of the inventive concepts. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the inventive concepts. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments of the inventive concepts. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Example embodiments of the inventive concepts are described herein with reference to schematic illustrations of idealized embodiments (and intermediate structures) of the inventive concepts. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

FIG. 1 is a block diagram illustrating an electronic system according to at least some example embodiments of the inventive concepts.

Referring to FIG. 1, an electronic system 10 may include a host 15 and a memory system 20. The memory system 20 may include a memory controller 100 and a plurality of semiconductor memory devices 200a~200k (k is an integer greater than two).

The host 15 may communicate with the memory system 20 through various interface protocols such as Peripheral Component Interconnect-Express (PCI-E), Advanced Technology Attachment (ATA), Serial ATA (SATA), Parallel ATA (PATA), or serial attached SCSI (SAS). In addition, the host 15 may also communicate with the memory system 20 through interface protocols such as Universal Serial Bus (USB), Multi-Media Card (MMC), Enhanced Small Disk Interface (ESDI), or Integrated Drive Electronics (IDE).

The memory controller 100 may control an overall operation of the memory system 20. The memory controller 100 may control an overall data exchange between the host 15 and the plurality of semiconductor memory devices 200a~200k. For example, the memory controller 100 may write data in the plurality of semiconductor memory devices 200a~200k or read data from the plurality of semiconductor memory devices 200a~200k in response to request from the host 20.

In addition, the memory controller 100 may issue operation commands to the plurality of semiconductor memory devices 200a~200k for controlling the plurality of semiconductor memory devices 200a~200k.

According to at least some example embodiments of the inventive concepts, each of the plurality of semiconductor memory devices 200a~200k may be a memory device including resistive type memory cells such as, for example, a magnetoresistive random access memory (MRAM), a resistive random access memory (RRAM), a phase change random access memory (PRAM) and a ferroelectric random access memory (FRAM), etc. In other example embodiments, each of the plurality of semiconductor memory devices 200a~200k may be a memory device including dynamic memory cells such as, for example, a dynamic random access memory (DRAM).

An MRAM is a nonvolatile computer memory based on magnetoresistance. An MRAM is different from a volatile RAM in many aspects. For example, since an MRAM is nonvolatile, the MRAM may retain all stored data even when power is turned off.

Although a nonvolatile RAM is generally slower than a volatile RAM, an MRAM has read and write response times comparable with read and write response times of a volatile RAM. Unlike a conventional RAM that stores data as electric charge, an MRAM stores data by using magnetoresistance (or magnetoresistive) elements. In general, a magnetoresistance element is made of two magnetic layers, each having a magnetization.

An MRAM is a nonvolatile memory device that reads and writes data by using a magnetic tunnel junction pattern including two magnetic layers and an insulating film disposed between the two magnetic layers. A resistance value of the magnetic tunnel junction pattern may vary according to a magnetization direction of each of the magnetic layers. The MRAM may program or remove data by using the variation of the resistance value.

An MRAM using a spin transfer torque (STT) phenomenon uses a method in which when a spin-polarized current flows in one direction, a magnetization direction of the magnetic layer is changed due to the spin transfer of electrons. A magnetization direction of one magnetic layer (e.g., a pinned layer) may be fixed and a magnetization direction of the other magnetic layer (e.g., a free layer) may vary according to a magnetic field generated by a program current.

The magnetic field of the program current may arrange the magnetization directions of the two magnetic layers in parallel or in anti-parallel. In at least one example embodiment, if the magnetization directions of the two magnetic layers are parallel, a resistance between the two magnetic layers is in a low ("0") state. If the magnetization directions of the two magnetic layers are anti-parallel, a resistance between the two magnetic layers is in a high ("1") state. Switching of the magnetization direction of the free layer and the high or low state of the resistance between the two magnetic layers result in write and read operations of the MRAM.

Although the MRAM is nonvolatile and provides a quick response time, an MRAM cell has a limited scale and is sensitive to write disturbance because the program current applied to switch the high and low states of the resistance between the magnetic layers of the MRAM is typically high. Accordingly, when a plurality of cells are arranged in an MRAM array, a program current applied to one memory cell changes a magnetic field of a free layer of an adjacent cell. Such a write disturbance may be mitigated (or alternatively, prevented) by using an STT phenomenon. A typical STT-MRAM may include a magnetic tunnel junction (MTJ), which is a magnetoresistive data storage device including two magnetic layers (e.g., a pinned layer and a free layer) and an insulating layer disposed between the two magnetic layers.

A program current typically flows through the MTJ. The pinned layer spin-polarizes electrons of the program current, and a torque is generated as the spin-polarized electron current passes through the MTJ. The spin-polarized electron current applies the torque to the free layer while interacting with the free layer. When the torque of the spin-polarized electron current passing through the MTJ is greater than a threshold switching current density, the torque applied by the spin-polarized electron current is sufficient to switch a magnetization direction of the free layer. Accordingly, the magnetization direction of the free layer may be parallel or anti-parallel to the pinned layer and a resistance state in the MTJ is changed.

The STT-MRAM removes a requirement of an external magnetic field for the spin-polarized electron current to switch the free layer in the magnetoresistive device. In addition, the STT-MRAM improves scaling as a cell size is reduced and the program current is reduced to mitigate (or alternatively, prevent) the write disturbance. In addition, the STT-MRAM may have a high tunnel magnetoresistance ratio, which improves a read operation in a magnetic domain by allowing a high ratio between the high and low states.

An MRAM is an all-round memory device that is low cost and has high capacity (like a dynamic random access memory (DRAM), operates at high speed (like a static random access memory (SRAM), and is nonvolatile (like a flash memory).

Figure 2A:
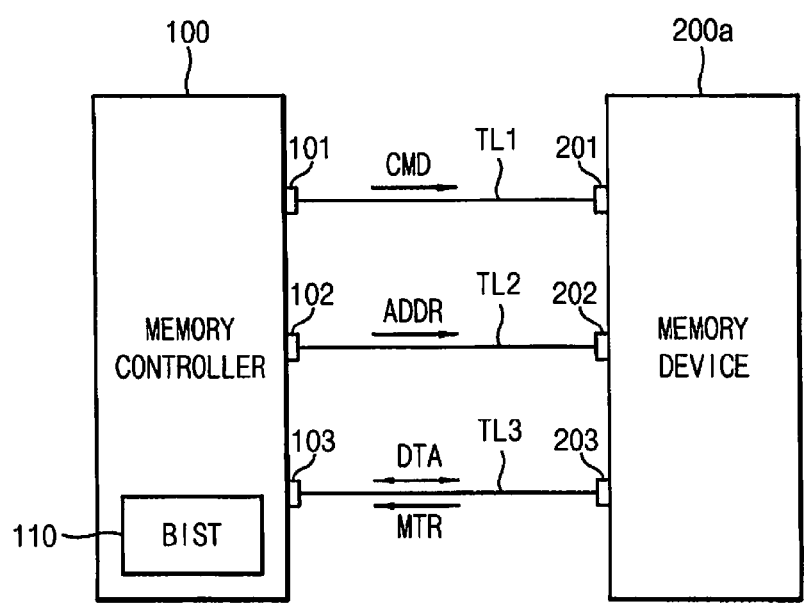
FIG. 2A is a block diagram illustrating the memory system shown in FIG. 1.

FIG. 2A is a block diagram illustrating the memory system shown in FIG. 1.

In FIG. 2A, only one semiconductor memory device 200a in communication with the memory controller 100 is illustrated for convenience. However, the details discussed herein related to semiconductor memory device 200a may equally apply to the other semiconductor memory devices 200b~200k.

Referring to FIG. 2A, the memory system 20 may include the memory controller 100 and the semiconductor memory device 200a. Each of the memory controller 100 and the semiconductor memory device 200a may be formed as a separate semiconductor chip or as a separate group of chips (e.g., semiconductor memory device 200a may be or, alternatively, include a stack of semiconductor chips in a semiconductor package). The memory controller 100 and the semiconductor memory device 200a may be connected to each other through corresponding command pins 101 and 201, corresponding address pins 102 and 202 and corresponding data pins 103 and 203. The command pins 101 and 201 may transmit a command signal CMD through a command transmission line TL1, the address pins 102 and 202 may transmit an address signal ADDR through an address transmission line TL2, and the data pins 103 and 203 may transmit data DTA in a normal mode or may transmit a test pattern data TP and receive merged test results MTR through a data transmission line TL3. The memory controller 100 may include a built-in self-test (BIST) circuit 110 that generates the test pattern data and receives the merged test results MTR in the test mode of the semiconductor memory device 200a.

The semiconductor memory device 200a may sequentially read first units of data from N memory cell rows of the plurality of memory cell rows (N is an integer equal to or greater than two), respectively, may generate the merged test results MTR by comparing bits read from the first units of the N memory cell rows and may output the merged test results MTR during the test mode of the semiconductor memory device 200a. The merged test results MTR may include result bits each indicating whether correspondingly-located bits in the first units, read from each of corresponding locations in the N memory cell rows have a same value with respect to each other. The memory controller 100 may determine to repair the N memory cell rows or not based on the merged test results MTR.

Figure 2B:
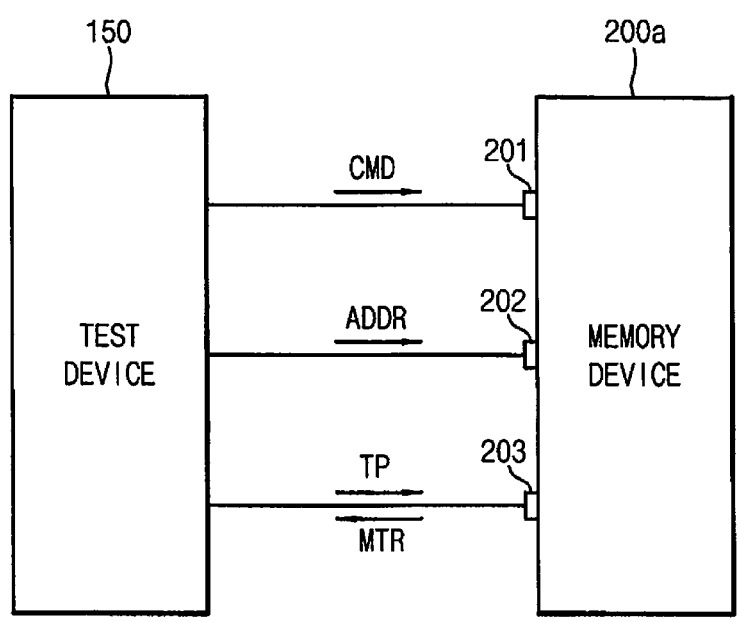
FIG. 2B is a block diagram illustrating a memory system according to at least some example embodiments of the inventive concepts.

FIG. 2B is a block diagram illustrating a memory system according to at least some example embodiments of the inventive concepts.

Referring to FIG. 2B, a memory system 30 may include a test device 150 and the semiconductor memory device 200a.

The test device 150, in a test mode of the semiconductor memory device 200a, applies a command CMD indicating the test mode to the semiconductor memory device 200a through the command pin 201, applies an address ADDR designating memory cells to be tested to the semiconductor memory device 200a through the address pin 202, and applies a test pattern data TP to the semiconductor memory device 200a through the data pin 203, and receives the merged test results MTR from semiconductor memory device 200a through the data pin 203.

The semiconductor memory device 200a may sequentially read first units of data from the N memory cell rows respectively, may generate the merged test results MTR by comparing bits read from the first units of the N memory cell rows and may output the merged test results MTR during the test mode of the semiconductor memory device 200a. The first unit may correspond to data of a burst length of the semiconductor memory device 200a, and the N memory cell rows may correspond to a unit of repair of the semiconductor memory device 200a. The test device 150 may determine to repair the N memory cell rows or not based on the merged test results MTR.

According to at least one example embodiment of the inventive concepts, the memory controller 100, test device 150, and semiconductor devices 200 may each be implemented by (or, alternatively, include) one or more circuits or circuitry (e.g., hardware) specifically structured to carry out some or all of the operations described herein with respect to the memory controller 100, test device 150, and/or semiconductor devices 200. According to at least one example embodiment of the inventive concepts, the memory controller 100, test device 150, and semiconductor devices 200 may each be implemented by (or, alternatively, include) a memory and one or more processors executing computer-readable code (e.g., software) that is stored in the memory and includes instructions corresponding to some or all of the operations described herein as being performed by the memory controller 100, test device 150, and/or semiconductor devices 200. According to at least one example embodiment of the inventive concepts, the memory controller 100, test device 150, and semiconductor devices 200 may each be implemented by (or, alternatively, include), for example, a combination of the above-referenced hardware and software.

The term 'processor', as used herein, may refer to, for example, a hardware-implemented data processing device having circuitry that is physically structured to execute desired operations including, for example, operations represented as code and/or instructions included in a program. Examples of the above-referenced hardware-implemented data processing device include, but are not limited to, a microprocessor, a central processing unit (CPU), a processor core, a multi-core processor; a multiprocessor, an application-specific integrated circuit (ASIC), and a field programmable gate array (FPGA).

Figure 3:
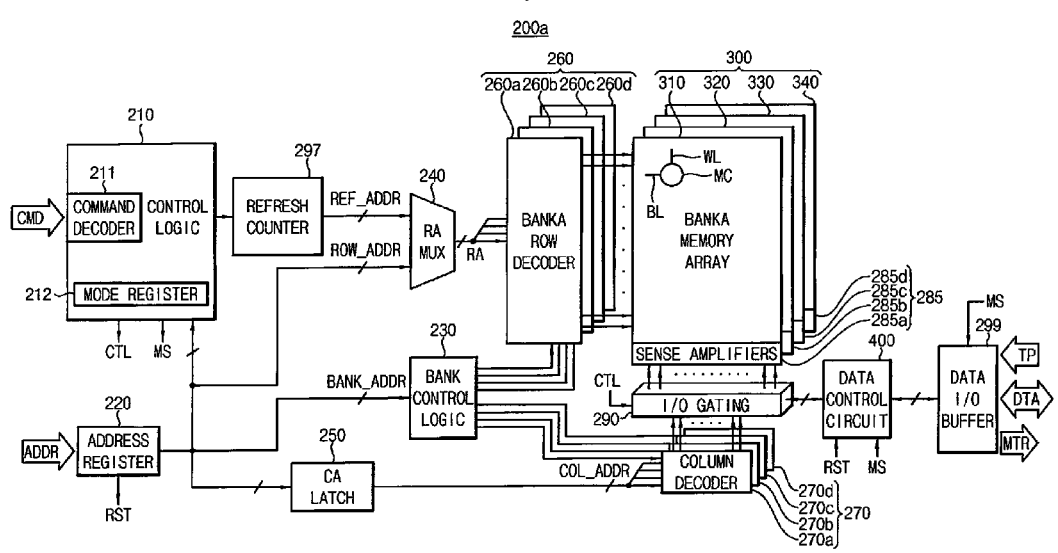
FIG. 3 is a block diagram illustrating the semiconductor memory device shown in FIG. 2A and FIG. 2B.

FIG. 3 is a block diagram illustrating the semiconductor memory device shown in FIG. 2A and FIG. 2B.

Referring to FIG. 3, the semiconductor memory device 200a may include a control logic (or a control logic circuit) 210, an address register 220, a bank control logic 230, a refresh counter 297, a row address multiplexer 240, a column address latch 250, a row decoder 260, a column decoder 270, a memory cell array 300, a sense amplifier unit 285, an input/output (I/O) gating circuit 290, a data control circuit 400 and a data input/output (I/O) buffer 299. According to at least one example embodiment, each of the above-referenced components of the semiconductor memory device 200a may be implemented as a circuit or circuitry.

The memory cell array 300 may include first through fourth bank arrays 310~340. The row decoder 260 may include first through fourth bank row decoders 260a~260d respectively coupled to the first through fourth bank arrays 310~340, the column decoder 270 may include first through fourth bank column decoders 270a~270d respectively coupled to the first through fourth bank arrays 310~340, and the sense amplifier unit 285 may include first through fourth bank sense amplifiers 285a~285d respectively coupled to the first through fourth bank arrays 310~340. Each of the first through fourth bank arrays 310~340 may include a plurality of memory cells MC, and each of memory cells MC is coupled to a corresponding word-line WL and a corresponding bit-line BL. The first through fourth bank arrays 310~340, the first through fourth bank row decoders 260a~260d, the first through fourth bank column decoders 270a~270d and first through fourth bank sense amplifiers 285a~285d may form first through fourth banks. Although the semiconductor memory device 200a shown in FIG. 3 illustrates four banks, the semiconductor memory device 200a may include other number of banks.

The address register 220 may receive an address ADDR including a bank address BANK_ADDR, a row address ROW_ADDR and a column address COL_ADDR from the memory controller 100. The address register 220 may provide the received bank address BANK_ADDR to the bank control logic 230, may provide the received row address ROW_ADDR to the row address multiplexer 240, and may provide the received column address COL_ADDR to the column address latch 250. The address register 220 may output a reset signal RST which is activated whenever the address register 220 receives the address ADDR corresponding to the second unit of data. The bank control logic 230 may be, for example, a bank control logic circuit.

The bank control logic 230 may generate bank control signals in response to the bank address BANK_ADDR. One of the first through fourth bank row decoders 260a~260d corresponding to the bank address BANK_ADDR may be activated in response to the bank control signals, and one of the first through fourth bank column decoders 270a~270d corresponding to the bank address BANK_ADDR may be activated in response to the bank control signals.

The refresh counter 297 may generate a refresh row address REF_ADDR for refreshing memory cell rows in the memory cell array 300 under control of the control logic 210.

The row address multiplexer 240 may receive the row address ROW_ADDR from the address register 220, and may receive the refresh row address REF_ADDR from the refresh counter 297. The row address multiplexer 240 may selectively output the row address ROW_ADDR or the refresh row address REF_ADDR as a row address RA. The row address RA that is output from the row address multiplexer 240 may be applied to the first through fourth bank row decoders 260a~260d.

The activated one of the first through fourth bank row decoders 260a~260d may decode the row address RA that is output from the row address multiplexer 240, and may activate a word-line corresponding to the row address RA. For example, the activated bank row decoder may apply a word-line driving voltage to the word-line corresponding to the row address RA.

The column address latch 250 may receive the column address COL_ADDR from the address register 220, and may temporarily store the received column address COL_ADDR. According to at least some example embodiments of the inventive concepts, in a burst mode, the column address latch 250 may generate column addresses that are increased in increments with respect to the received column address COL_ADDR. The column address latch 250 may apply the temporarily stored or generated column address to the first through fourth bank column decoders 270a~270d.

The activated one of the first through fourth bank column decoders 270a~270d may decode the column address COL_ADDR that is output from the column address latch 250, and may control the I/O gating circuit 290 in order to output data corresponding to the column address COL_ADDR.

The I/O gating circuit 290 may include a circuitry for gating input/output data. The I/O gating circuit 290 may further include read data latches for storing data that is output from the first through fourth bank arrays 310~340, and write drivers for writing data to the first through fourth bank arrays 310~340.

Data read from one bank array of the first through fourth bank arrays 310~340 may be sensed by sense amplifiers coupled to the one bank array from which the data is to be read, and may be stored in the read data latches. The data stored in the read data latches may be provided to the memory controller 100 via the data control circuit 400 and the data I/O buffer 299. Data DTA to be written in one bank array of the first through fourth bank arrays 310~340 may be provided to the data I/O buffer 299 from the memory controller 100. The data DTA provided to the data I/O buffer 299 is written in the memory cell array 300 via the data control circuit 400 and the I/O gating circuit 290.

The data I/O buffer 299 receives test pattern data TP from an external device in a test mode, provides the test pattern data TP to the I/O gating circuit 290 via the data control circuit 400. The I/O gating circuit 290 writes the test pattern data TP to a target page of the memory cell array 300 and reads the test pattern data TP from the target page to provide test result data TR to the data control circuit 400.

The data control circuit 400 may sequentially read first units of data from N memory cell rows of the plurality of memory cell rows, respectively, may generate the merged test results MTR by comparing bits read from the first units of the N memory cell rows and may output the merged test results MTR during the test mode of the semiconductor memory device 200a. The merged test results MTR may include result bits each indicating whether correspondingly-located bits in the first units, read from each of corresponding locations in the N memory cell rows have a same value with respect to each other. The memory controller 100 and the test device 150 may determine to repair the N memory cell rows or not based on the merged test results MTR.

The control logic 210 may control operations of the semiconductor memory device 200a. For example, the control logic 210 may generate control signals for the semiconductor memory device 200a in order to perform a write operation or a read operation. The control logic 210 may include a command decoder 211 that decodes a command CMD received from the memory controller 100 and a mode register 212 that sets an operation mode of the semiconductor memory device 200a.

For example, the command decoder 211 may generate the control signals corresponding to the command CMD by decoding a write enable signal (/WE), a row address strobe signal (/RAS), a column address strobe signal (/CAS), a chip select signal (/CS), etc. The command decoder 211 may generate a mode signal MS directing an operation mode of the semiconductor memory device 200a and may generate a control signal CTL that controls the I/O gating circuit 290 by decoding the command CMD. The control logic 210 may provide the mode signal MS to the data I/O buffer 299 and the data control circuit 400.

FIGS. 4A to 4E are circuit diagrams of examples of the memory cell shown in FIG. 3.

Figure 4A:
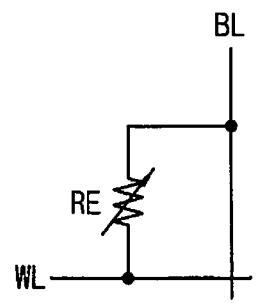
FIGS. 4A to 4E are circuit diagrams of examples of the memory cell shown in FIG. 3.
Figure 4B:
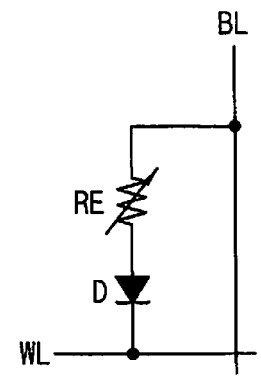
Figure 4C:
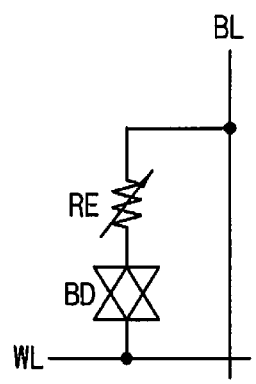
Figure 4D:
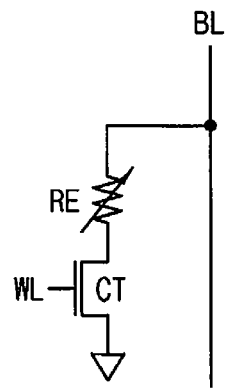
Figure 4E:
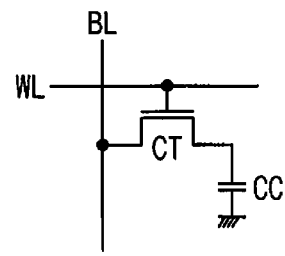

FIGS. 4A to 4D illustrate memory cells MC which are implemented with resistive type memory cells and FIG. 4E illustrates a memory cell MC which is implemented with a dynamic memory cell.

FIG. 4A illustrates a resistive type memory cell without a selection element, while FIGS. 4B to 4D show resistive type memory cells each comprising a selection element.

Referring to FIG. 4A, a memory cell MC may include a resistive element RE connected to a bit-line BL and a word-line WL. Such a resistive memory cell having a structure without a selection element may store data by a voltage applied between bit-line BL and word-line WL.

Referring to FIG. 4B, a memory cell MC may include a resistive element RE and a diode D. The resistive element RE may include a resistive material for data storage. The diode D may be a selection element (or switching element) that supplies current to resistive element RE or cuts off the current supply to resistive element RE according to a bias of word-line WL and bit-line BL. The diode D may be coupled between the resistive element RE and word-line WL, and the resistive element RE may be coupled between the bit-line BL and the diode D. Positions of the diode D and the resistive element RE may be interchangeable. The diode D may be turned on or turned off by a word-line voltage. Thus, a resistive memory cell may be not driven where a voltage of a constant level or higher is supplied to an unselected word-line WL.

Referring to FIG. 4C, a memory cell MC may include a resistive element RE and a bidirectional diode BD. The resistive element R may include a resistive material for data storage. The bidirectional diode BD may be coupled between the resistive element RE and a word-line WL, and the resistive element RE may be coupled between a bit-line BL and bidirectional diode BD. Positions of the bidirectional diode BD and the resistive element RE may be interchangeable. The bidirectional diode BD may block leakage current flowing to an unselected semiconductor memory cell.

Referring to FIG. 4D, a memory cell MC may include a resistive element RE and a transistor CT. The transistor CT may be a selection element (or switching element) that supplies current to the resistive element RE or cuts off the current supply to the resistive element RE according to a voltage of a word-line WL. The transistor CT may be coupled between the resistive element RE and a word-line WL, and the resistive element RE may be coupled between a bit-line BL and the transistor CT. Positions of the transistor CT and the resistive element RE may be interchangeable. The semiconductor memory cell may be selected or unselected depending on whether the transistor CT drive by word-line WL is turned on or turned off.

Referring to FIG. 4E, a memory cell MC may include a cell capacitor CC and a transistor CT. The transistor CT may be a selection element (or switching element) that connects/disconnects the cell capacitor CC to/from bit-line BL according to a voltage of a word-line WL. The transistor CT may be coupled between the cell capacitor CC, a word-line WL and a bit-line BL, and the cell capacitor CC may be coupled between the transistor CT and a plate voltage (not illustrated).

Figure 5:
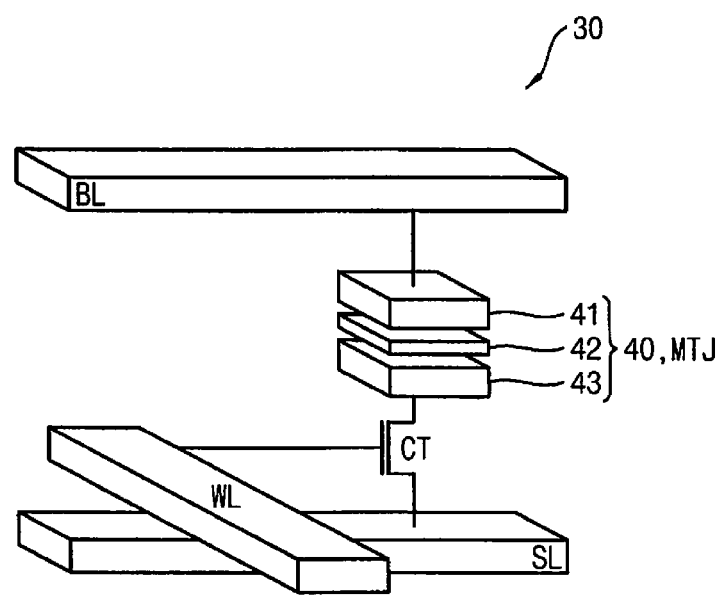
FIG. 5 illustrates an example of the memory cell (referred to as spin-transfer torque magnetoresistive random access memory (STT-MRAM cell)) shown in FIG. 3.

FIG. 5 illustrates an example of the memory cell (referred to as STT-MRAM cell) shown in FIG. 3.

Referring to FIG. 5, an STT-MRAM cell 30 may include a MTJ element 40 and a cell transistor CT. A gate of the cell transistor CT is connected to a word-line WL and one electrode of the cell transistor CT is connected through the MTJ 40 to a bit-line BL. Also, the other electrode of the cell transistor CT is connected to a source line SL.

The MTJ element 40 may include the free layer 41, the pinned layer 43, and a tunnel layer 42 disposed between the free layer 41 and the pinned layer 43. A magnetization direction of the pinned layer 43 may be fixed, and a magnetization direction of the free layer 41 may be parallel to or anti-parallel to the magnetization direction of the pinned layer 43 according to written data. In order to fix the magnetization direction of the pinned layer 43, for example, an anti-ferromagnetic layer (not shown) may be further provided.

In order to perform a write operation of the STT-MRAM cell 30, a logic high voltage is applied to the word-line WL to turn on the cell transistor CT. A program current, that is, a write current is applied to the bit-line BL and the source line SL. A direction of the write current is determined by a logic state of the MTJ element 40.

In order to perform a read operation of the STT-MRAM cell 30, a logic high voltage is applied to the word-line WL to turn on the cell transistor CT, and a read current is supplied to the bit-line BL and the source line SL. Accordingly, a voltage is developed at both ends of the MTJ element 40, is detected by the sense amplifier 285a, and is compared with a reference voltage from a reference voltage to determine a logic state of the MTJ element 40. Accordingly, data stored in the MTJ element 40 may be detected.

Figure 6A:
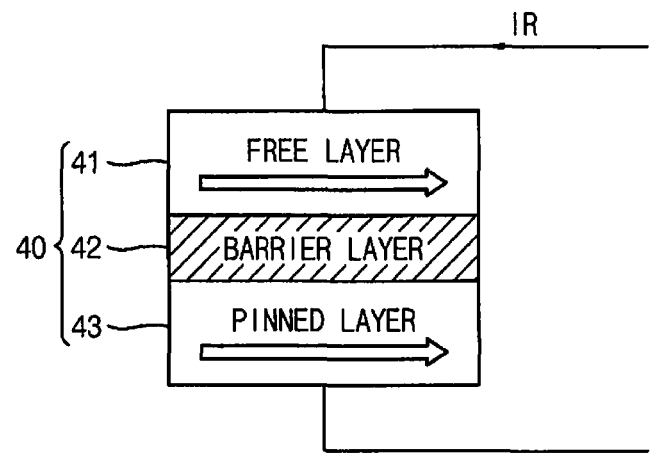
FIGS. 6A and 6B illustrate a magnetization direction according to data written to the magnetic tunnel junction (MTJ) element shown in FIG. 5.
Figure 6B:
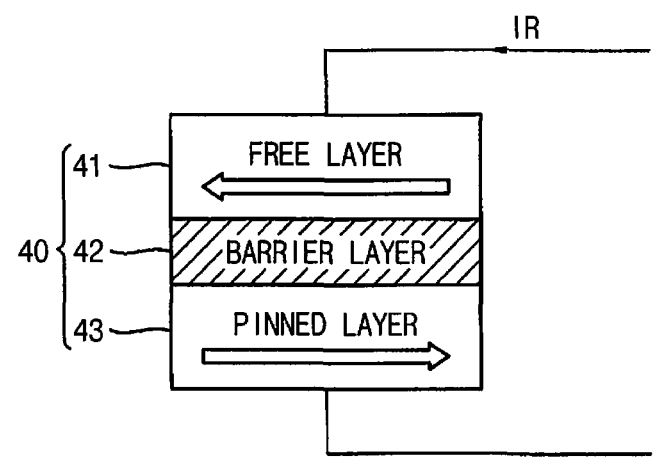

FIGS. 6A and 6B illustrate a magnetization direction according to data written to the MTJ element shown in FIG. 5.

A resistance value of the MTJ element 40 may vary according to a magnetization direction of the free layer 41. When a read current IR flows through the MTJ 40, a data voltage is output according to the resistance value of the MTJ element 40. Since the read current IR is much smaller than a write current, a magnetization direction of the free layer 41 is not changed by the read current IR.

In the example shown in o FIG. 6A, a magnetization direction of the free layer 41 and a magnetization direction of the pinned layer 43 of the MTJ element 40 are parallel. Accordingly, the MTJ element 40 may have a high resistance value. In this case, the MTJ element 40 may read data '0'.

In the example shown in FIG. 6B, a magnetization direction of the free layer 41 and a magnetization direction of the pinned layer 43 of the MTJ element 40 are anti-parallel. Accordingly, the MTJ element 40 may have a high resistance value. In this case, the MTJ element 40 may read data '1'.

Although the free layer 41 and the pinned layer 43 of the MTJ element 40 are horizontal magnetic layers, example embodiments are not limited thereto and the free layer 41 and the pinned layer 43 may be, for example, vertical magnetic layers.

Figure 7:
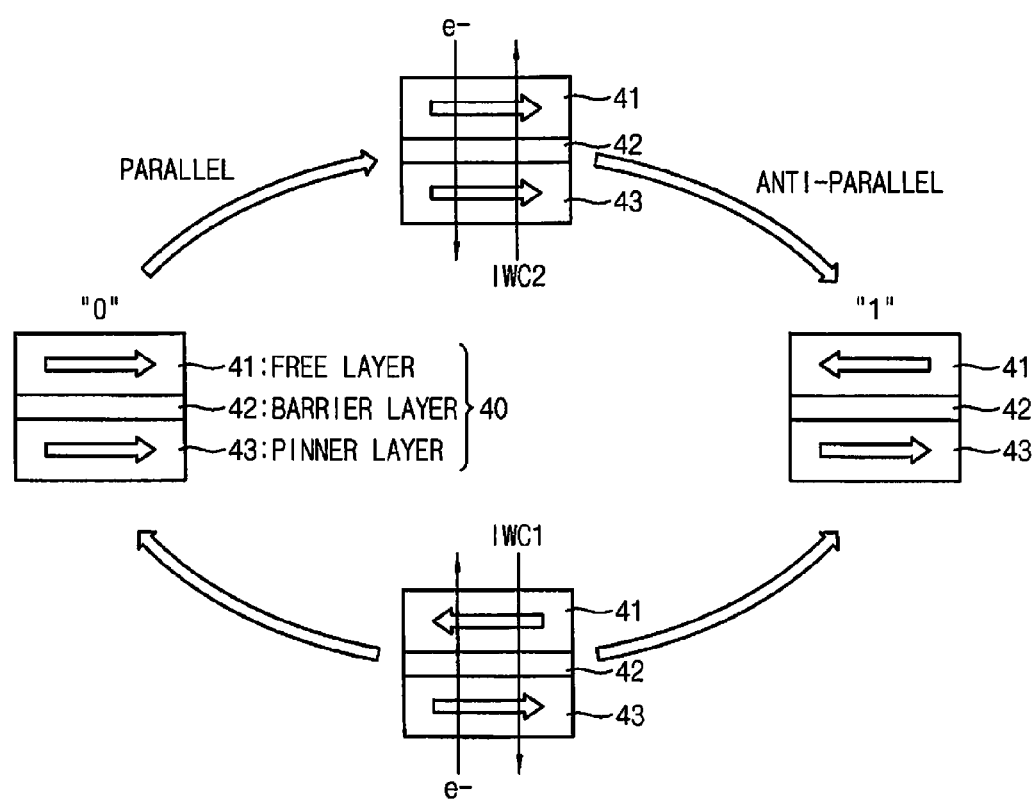
FIG. 7 is a block diagram for explaining a write operation of the STT-MRAM cell shown in FIG. 5.

FIG. 7 is a block diagram for explaining a write operation of the STT-MRAM cell shown in FIG. 5.

Referring to FIG. 7, a magnetization direction of the free layer 41 may be determined based on a direction of a write current IW flowing through the MTJ element 40. For example, when a first write current IWC1 is supplied from the free layer 41 to the pinned layer 43, free electrons having the same spin direction as that of the pinned layer 43 apply a torque to the free layer 41. Accordingly, the free layer 41 may be magnetized parallel to the pinned layer 43.

When a second write current IWC2 is applied from the pinned layer 43 to the free layer 41, electrons having a spin direction opposite to that of the pinned layer 41 return to the free layer 43 and apply a torque. Accordingly, the free layer 41 may be magnetized anti-parallel to the pinned layer 43. That is, a magnetization direction of the free layer 41 of the MTJ element 40 may be changed by an STT.

Figure 8:
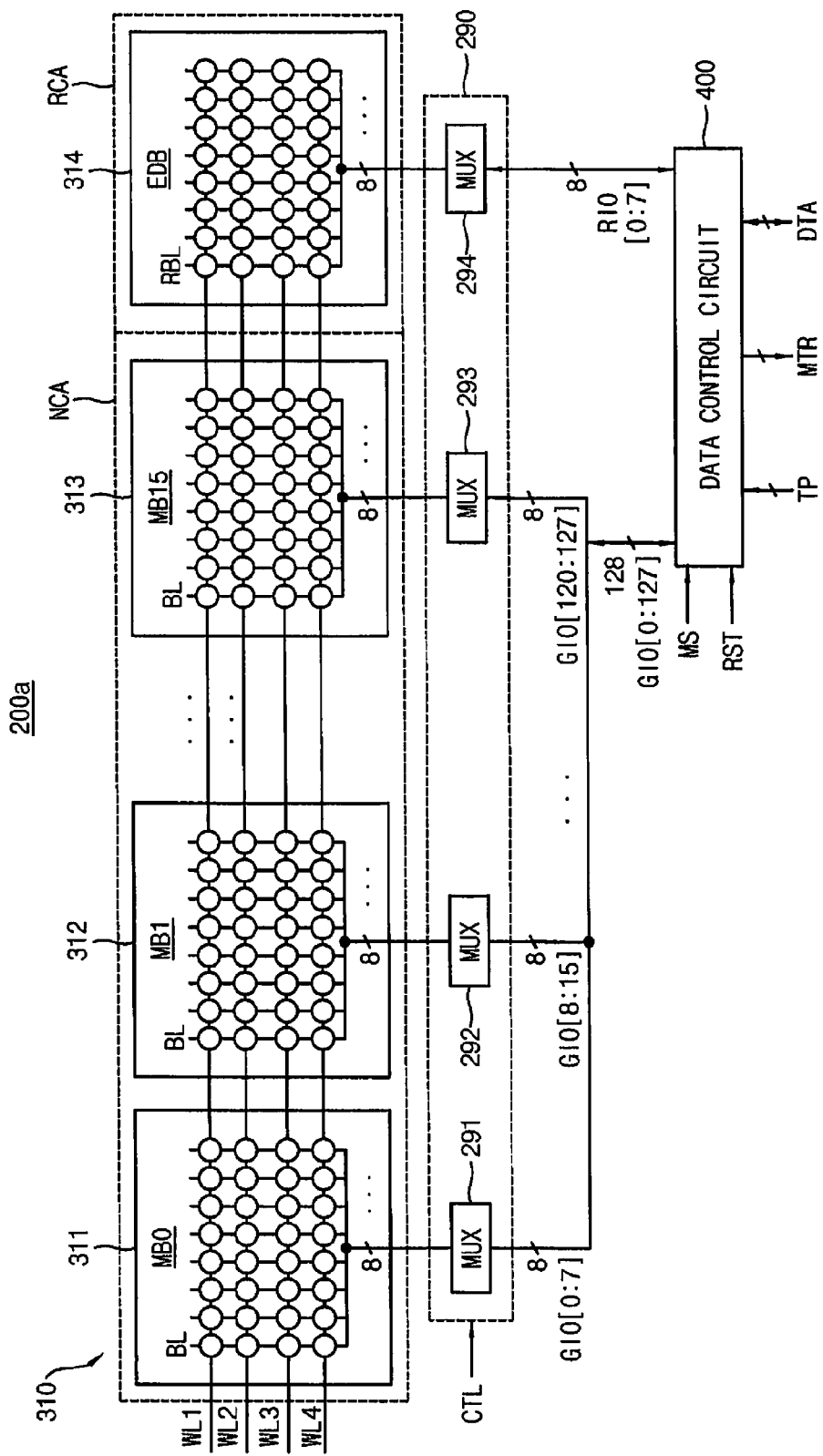
FIG. 8 illustrates a portion of the semiconductor memory device of FIG. 3.

FIG. 8 illustrates a portion of the semiconductor memory device of FIG. 3.

In FIG. 8, the first bank array 310, the I/O gating circuit 290, and the data control circuit 400 are illustrated.

Referring to FIG. 8, the first bank array 310 may include a normal cell array NCA and a redundancy cell array RCA. The normal cell array NCA may include a plurality of first memory blocks MB0~MB15, i.e., 311~313, and the redundancy cell array RCA may include at least a second memory block 314. The first memory blocks 311~313 are memory blocks determining a memory capacity of the semiconductor memory device 200a. The second memory block 314 is for a redundancy repair.

According to at least one example embodiment of the inventive concepts, in each of the first memory blocks 311~313, a plurality of first memory cells are arrayed in rows and columns. In the second memory block 314, a plurality of second memory cells are arrayed in rows and columns.

In the first memory blocks 311~313, rows may be formed, for example, of 8K word-lines WL and columns may be formed, for example, of 1K bit-lines BL. Memory cells connected to intersections of the word-lines WL and the bit-lines BL may be dynamic memory cells or resistive type memory cells. In FIG. 8, there are illustrated word-lines WL1~WL4 of the 8K word-lines WL, which correspond to the unit of repair of the semiconductor memory device 200a.

The I/O gating circuit 290 may include, for example, a plurality of switching circuit 291~294 respectively connected to the first memory blocks 311~313 and the second memory block 314. In the semiconductor memory device 200a, bit-lines corresponding to data of a burst length may be simultaneously accessed to support the BL indicating the maximum number of column locations that is accessible. For example, if the burst length is set to 8, data bits may be set to 128 bits.

According to at least one example embodiment of the inventive concepts, the data control circuit 400 is connected to the switching circuit 291~294 through corresponding first data lines GIO[0:127] and second data lines EDBIO[0:7]. The data control circuit 400 sequentially reads the first unit of test pattern data as the test result data from each of the N (corresponding to four) memory cell rows (memory cell rows connected to the word-lines WL1~WL4) in the first memory blocks 311~313, generates the merged test results MTR by comparing bits read from the first units of the N memory cell rows, in response to at least the mode signal MS and the reset signal RST during the test mode of the semiconductor memory device 200a. The merged test results MTR may include result bits each indicating whether correspondingly-located bits in the first units, read from each of corresponding locations in the N memory cell rows have a same value with respect to each other.

According to at least one example embodiment of the inventive concepts, the data control circuit 400 writes the data DTA from the memory controller 100 in the target page of the first memory blocks 311, 312 and 313 in a write operation during a normal mode of the semiconductor memory device 200a, and reads the data DTA from the target page of the first memory blocks 311, 312 and 313 in a read operation during the normal mode. The data control circuit 400 writes the test pattern data TP from the memory controller 100 or the test device 150 in the target page of the first memory blocks 311, 312 and 313 in a write operation during the test mode of the semiconductor memory device 200a and sequentially reads the first unit of test result data from each of the target pages (or N target pages) in the first memory blocks 311, 312 and 313, generates the merged test results MTR by comparing the bits read from the first units of the N memory cell rows. The merged test results MTR may include the result bits each indicating whether correspondingly-located bits.

Figure 9:
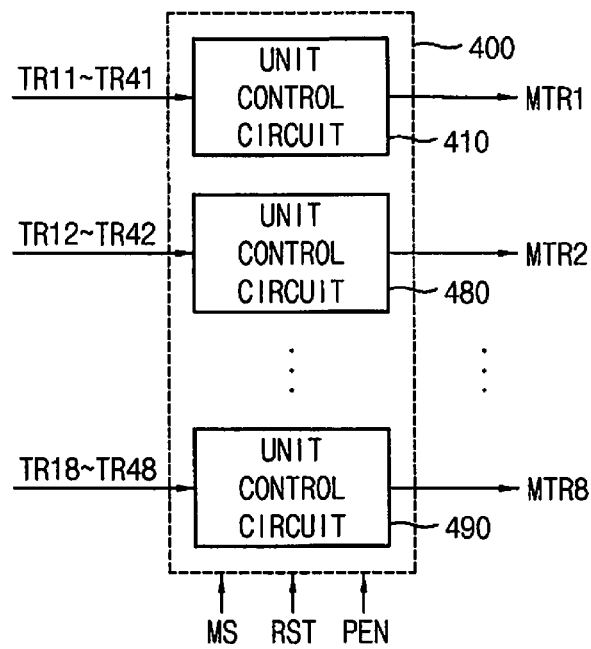
FIG. 9 is a block diagram illustrating the data control circuit shown in FIG. 8 according to at least some example embodiments of the inventive concepts.

FIG. 9 is a block diagram illustrating the data control circuit shown in FIG. 8 according to at least some example embodiments of the inventive concepts.

In the example shown in FIG. 9, it is assumed that data stored in the memory cell rows (N memory cell rows), which are in the memory block 311 and are connected to the word-lines WL1~WL4, is considered as a unit of repair. It is also assumed that a first unit of test result data TR11~TR18 is read from first memory cells connected to the word-line WL1, a first unit of test result data TR21~TR28 is read from first memory cells connected to the word-line WL2, a first unit of test result data TR31~TR38 is read from first memory cells connected to the word-line WL3 and a first unit of test result data TR41~TR48 is read from first memory cells connected to the word-line WL4. Thus, according to at least one example embodiment of the inventive concepts, test result data represented as TRxy refers to an $y^{th}$ bit read from a $X^{th}$ word-line. Although the data stored in the memory cell rows, which are in the memory block 311 and are connected to the word-lines WL1~WL4, is assumed to be the unit of repair in FIG. 8, the unit of repair may be varied according to setting (e.g, the preferences of an operator and/or manufacturer of memory device 200a). For example, data stored in the memory cell rows in the two or more memory blocks, which are connected to the word-lines WL1~WL4, may be set as the unit of repair (i.e., the second unit of data) in FIG. 8.

Referring to FIGS. 8 and 9, the data control circuit 400 may include a plurality of unit control circuits 410, 480 and 490. Each of the unit control circuits 410, 480 and 490 may sequentially compare correspondingly-located bits TR11~TR41, TR12~TR42, . . . . , TR18~TR48 in the first units of data respectively (compare operation) in response to at least the mode signal MS and the reset signal RST, may selectively latch a comparison result according to the comparison result (selective latch operation) and may output each result bit MTR1~MTR8 of the merged test results MTR. Each of the unit control circuits 410, 480 and 490 may perform the comparison operation and the selective latch operation further in response to an enable pulse signal PEN in addition to the mode signal MS and the reset signal RST. As is illustrated in FIG. 8, correspondingly-located bits may be bits read from memory cells in corresponding locations with respect to different word-lines WL. For example, the second memory cell in word-line WL1, the second memory cell in word-line WL2, the second memory cell in word-line WL3, and the second memory cell in word-line WL4 correspond to each other. Accordingly, bits or test result data read from the second memory cell in word-line WL1, the second memory cell in word-line WL2, the second memory cell in word-line WL3, and the second memory cell in word-line WL4 (e.g., test result data bits TR21, TR22, TR23, and TR24) are corresponding bits.

The unit control circuit 410 may sequentially compare correspondingly-located first bits TR11~TR41 of the first units of test result data TR11~TR18, TR21~TR28, TR31~TR38 and TR41~TR48, may selectively latch a comparison result according to the comparison result and may output a first result bit MTR1 of the merged test results MTR. The unit control circuit 480 may sequentially compare correspondingly-located first bits TR12~TR42 of the first units of test result data TR11~TR18, TR21~TR28, TR31~TR38 and TR41~TR48, may selectively latch a comparison result according to the comparison result and may output a second result bit MTR2 of the merged test results MTR. The unit control circuit 490 may sequentially compare correspondingly-located first bits TR18~TR48 of the first units of test result data TR11~TR18, TR21~TR28, TR31~TR38 and TR41~TR48, may selectively latch a comparison result according to the comparison result and may output an eighth result bit MTR8 of the merged test results MTR.

Figure 10:
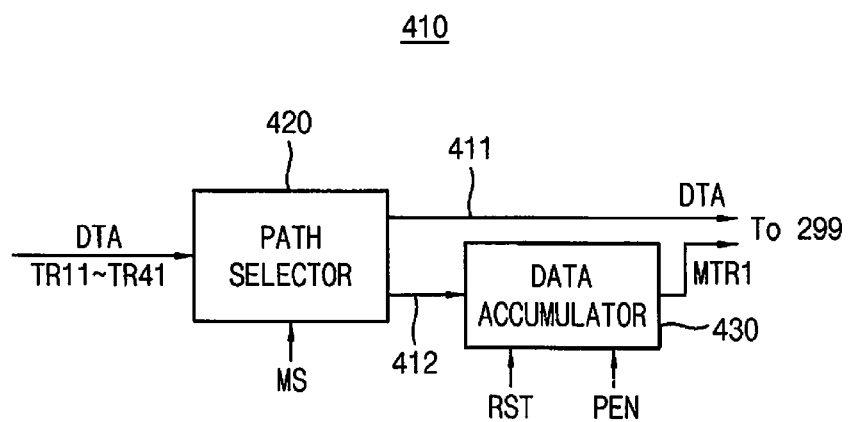
FIG. 10 illustrates one of the unit control circuits of the data control circuit shown in FIG. 9.

FIG. 10 illustrates one of the unit control circuit of the data control circuit shown in FIG. 9.

Although FIG. 10 illustrates the unit control circuit 410, each of the unit control circuits 480 and 490 has a substantially same configuration as the unit control circuit 410.

Referring to FIG. 10, the unit control circuit 410 may include a path selector 420 and a data accumulator 430.

The path selector 420 may provide the data DTA from the memory cell rows to the data I/O buffer 299 through a first path 411 during the normal mode and may provide the correspondingly-located bits TR11~TR41 the data accumulator 430 through a second path 412 during the test mode, in response to the mode signal MS. The data accumulator 430 may sequentially compare the correspondingly-located bits TR11~TR41, may selectively latch the comparison result and may output the first result bit MTR1 of the merged test results MTR. The data accumulator 430 may be reset (be initialized) in response to the reset signal whenever the data accumulator 430 outputs a last result bit of the merged test results MTR for each unit of repair.

In FIG. 10, operation of the unit control circuit 410 is described in a read operation. The unit control circuit 410 may provide the data DTA to the target pages in the first memory blocks in a write operation during the normal mode and may provide the test pattern data TP to the target pages in the first memory blocks in a write operation during the test mode.

Figure 11:
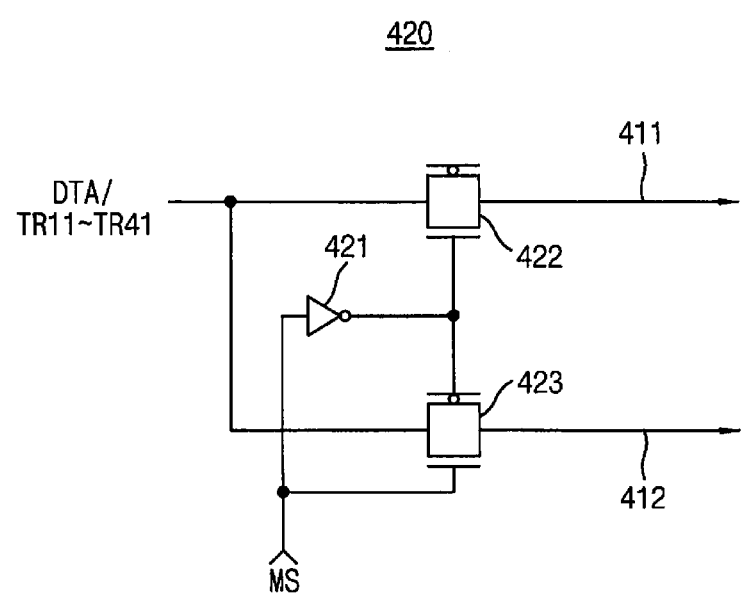
FIG. 11 illustrates an example of the path selector in the unit control circuit shown in FIG. 10.

FIG. 11 illustrates an example of the path selector in the unit control circuit shown in FIG. 10.

Referring to FIG. 11, the path selector 420 includes an inverter 421, a first transmission gate 422 and a second transmission gate 423.

The first transmission gate 422 is connected to the first path 411, i.e., a path in the normal mode and the second transmission gate 423 is connected to the second path 412, i.e., a path in the test mode. The inverter 421 inverts the mode signal MS to provide an inverted version of the mode signal MS to the first transmission gate 422 and the second transmission gate 423. According to at least one example embodiment of the inventive concepts, the mode signal MS has a first logic level (logic high level) in a read operation during the test mode, and the second transmission gate 423 is conducting. Therefore, the corresponding bits TR11~TR41 may be provided to the data accumulator 430 through the second path 412. The mode signal MS has a second logic level (logic low level) in a write operation during the test mode or during the normal mode, and the first transmission gate 422 is conducting. Therefore, the data DTA may be transmitted or received through the first path 411 during the normal mode and the test pattern data TP with a first logic level may be written in the memory cell rows through the first path 411.

Figure 12:
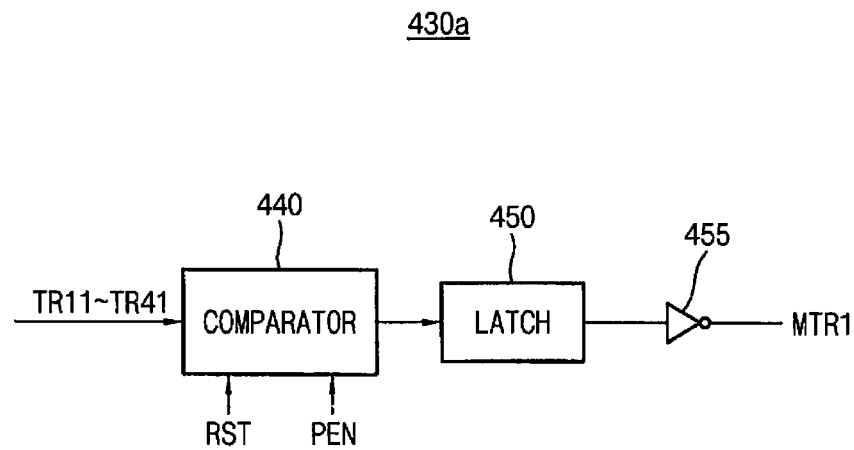
FIG. 12 illustrates an example of the data accumulator in the unit control circuit shown in FIG. 10.

FIG. 12 illustrates an example of the data accumulator in the unit control circuit shown in FIG. 10.

Referring to FIG. 12, a data accumulator 430a may include a comparator 440, a latch circuit 450 and an inverter 455.

The comparator 440 may sequentially compare the correspondingly-located bits TR11~TR41 in response to at least the reset signal RST. The latch circuit 450 may be connected to the comparator 440 at a first node and may latch an output of the comparator 440. The inverter 455 may invert an output of the latch circuit 450 to output the first result bit MTR1 of the merged test results MTR.

Figure 13:
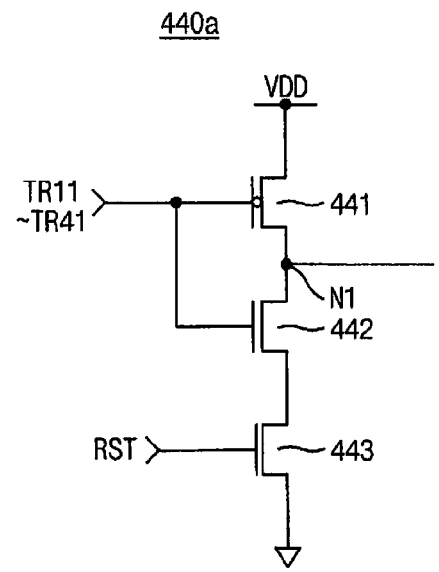
FIG. 13 illustrates an example of the comparator in the data accumulator shown in FIG. 12.

FIG. 13 illustrates an example of the comparator in the data accumulator shown in FIG. 12.

Referring to FIG. 13, a comparator 440a may include a p-channel metal-oxide semiconductor (PMOS) transistor 441 and n-channel metal-oxide semiconductor (NMOS) transistors 442 and 443.

The PMOS transistor 441 may be connected between a power supply voltage VDD and the first node N1 and may have a gate sequentially receiving the correspondingly-located bits TR11~TR41. The NMOS transistor 442 may be connected between the PMOS transistor 441 and the NMOS transistor 443 and may have a gate sequentially receiving the correspondingly-located bits TR11~TR41. The NMOS transistor 443 may be connected between the NMOS transistor 442 and a ground voltage and may have a gate receiving the reset signal RST. The PMOS transistor 441 and the NMOS transistor 442 may be connected at the first node N1, the first node N1 may be connected to the latch circuit 450 and the output of the comparator 440a may be provided at the first node N1.

Figure 14:
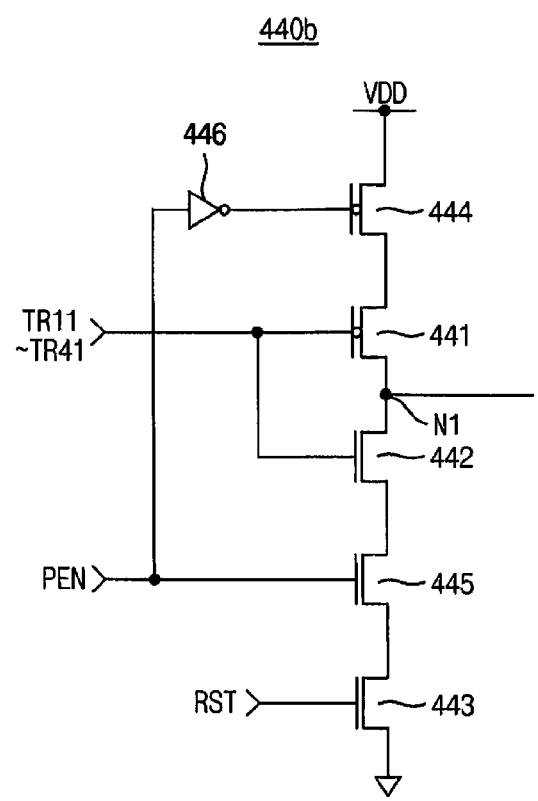
FIG. 14 illustrates another example of the comparator in the data accumulator shown in FIG. 12.

FIG. 14 illustrates another example of the comparator in the data accumulator shown in FIG. 12.

Referring to FIG. 14, a comparator 440b may include PMOS transistors 444 and 441, NMOS transistors 442, 445 and 443 and an inverter 446. The comparator 440b of FIG. 14 differs from the comparator 440a of FIG. 13 in that the comparator 440b of FIG. 14 further includes the inverter 446, the PMOS transistor 444 and the NMOS transistor 445.

The PMOS transistor 444 may be connected between the power supply voltage VDD and the PMOS transistor 441 and may have a gate receiving an output of the inverter 446. The NMOS transistor 445 may be connected between the NMOS transistors 442 and 443 and may have a gate receiving the enable pulse signal PEN. The inverter 446 may invert the enable pulse signal PEN to provide an inverted version of the enable pulse signal PEN to the gate of the PMOS transistor 444. When the enable pulse signal PEN has a first logic level, the PMOS transistor 444 and the NMOS transistor 445 are turned-on, the comparator 440b may be substantially same as the comparator 440a. The enable pulse signal PEN is maintained at a first logic level during the correspondingly-located bits TR11~TR14 being sequentially compared.

Figure 15:
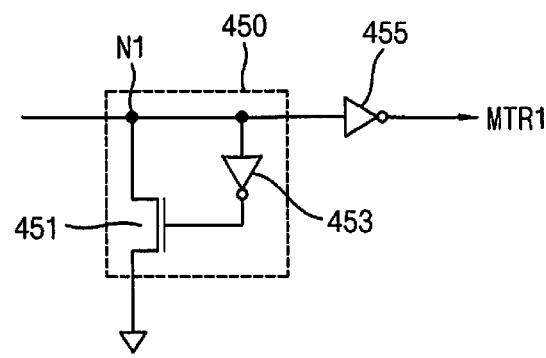
FIG. 15 illustrates the latch circuit and the inverter in the data accumulator shown in FIG. 12.

FIG. 15 illustrates the latch circuit and the inverter in the data accumulator shown in FIG. 12.

Referring to FIG. 15, the latch circuit 450 may include an NMOS transistor 451 and an inverter 453. The NMOS transistor 451 may be connected between the first node N1 and the ground voltage and the inverter 453 may be connected between the first node N1 and a gate of the NMOS transistor 451.

Referring to FIGS. 12 through 15, the PMOS transistor 441 is connected to the power supply voltage VDD, the NMOS transistor 443 is connected to the ground voltage and the reset signal RST is applied to the gate of the NMOS transistor 443 in the comparator 440a. Therefore, the comparator 440a may operate as an inverter during the reset signal RST having a first logic level, and thus the data accumulator 430a may be reset when the reset signal RST has a first logic level. When the reset signal RST has a second logic level and the corresponding bit TR11 has a second logic level, the PMOS transistor 441 is turned-on and the first node N1 has a first logic level. Therefore, the latch circuit 450 latches the first logic level of the first node N1 and the inverter 455 inverts the output of the latch circuit 450. Therefore, the first result bit MTR1 has a second logic level.

In addition, when the reset signal RST has a second logic level and the corresponding bit TR11 has a first logic level, the NMOS transistor 442 is turned-on the NMOS transistor 443 is turned-off. Therefore, a logic level of the first node N1 is maintained at a previous state. Therefore, the latch circuit 450 maintains the previous state and the first result bit MTR1 maintains the previous state.

The latch circuit 450 may latch the output of the comparator 440, which is a first logic level, when the reset signal RST has a second logic level and each of the corresponding bits TR11~TR41 has a second logic level.

In addition, when the reset signal RST has a second logic level and one or more of the correspondingly-located bits TR11~TR41 have a first logic level, the first result bit MTR1 has a second logic level, because the first result bit MTR1 is maintained at a previous state or has a second logic level when the reset signal RST has a second logic level.

Figure 16:
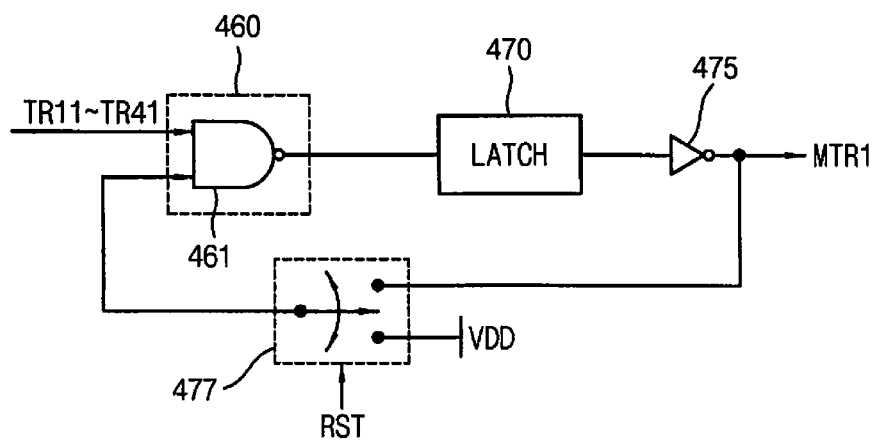
FIG. 16 illustrates another example of the data accumulator in the unit control circuit shown in FIG. 10.

FIG. 16 illustrates another example of the data accumulator in the unit control circuit shown in FIG. 10.

Referring to FIG. 16, a data accumulator 430b may include a comparator 460, a latch circuit 470, an inverter 475 and a switch 477. The comparator 460 may be implemented with a NAND gate 461.

The NAND gate 461 may sequentially receive the corresponding bits TR11~TR41 as a first input. The latch circuit 470 may latch an output of the NAND gate 461. The inverter 475 may invert an output of the latch circuit 470 to output the first result bit MTR1 of the merged test results (MTR). The switch 477 may provide one of an output of the inverter 475 and the power supply voltage VDD as a second input to the NAND gate 461 in response to the reset signal RST.

When the reset signal RST has a first logic level, the switch 477 provides the power supply voltage VDD as the second input of the NAND gate 461. Therefore, when the reset signal RST has a first logic level, the NAND gate 461 may operate as an inverter that sequentially inverts the correspondingly-located bits TR11~TR41. When the reset signal RST has a first logic level, the data accumulator 430b may be reset.

When the reset signal RST has a second logic level, the switch 477 provides the output of the inverter 475 as the second input of the NAND gate 461. Therefore, when the reset signal RST has a second logic level, the inverter 475 may output the first result bit MTR1 having a second logic level when at least one of each of the corresponding bits TR11~TR41 and the output of the latch circuit 470 has a second logic level.

FIG. 17 illustrates one of the correspondingly-located bits, the reset signal and the result bit when the data accumulator of FIG. 10 employs the implementations of FIGS. 13 and 15.

Referring to FIGS. 10, 13, 15 and 17, when the reset signal RST has a first logic level, the data accumulator 430a is reset and the correspondingly-located bit TR is latched and the first result bit MTR1 has a same logic level of the correspondingly-located bit TR. When the reset signal RST has a second logic level and the correspondingly-located bit TR has a second logic level, the output of the comparator 440, having a first logic level, is latched.

FIG. 18 illustrates one of the correspondingly-located bits, the reset signal and the result bit when the data accumulator of FIG. 10 employs the implementation of FIG. 16.

Referring to FIGS. 10, 16 and 18, when the reset signal RST has a second logic level and the at least one of the correspondingly-located bit TR and the output of the latch circuit 470 has a second logic level, the inverter 475 may output the first result bit MTR1 having a second logic level.

Figure 19:
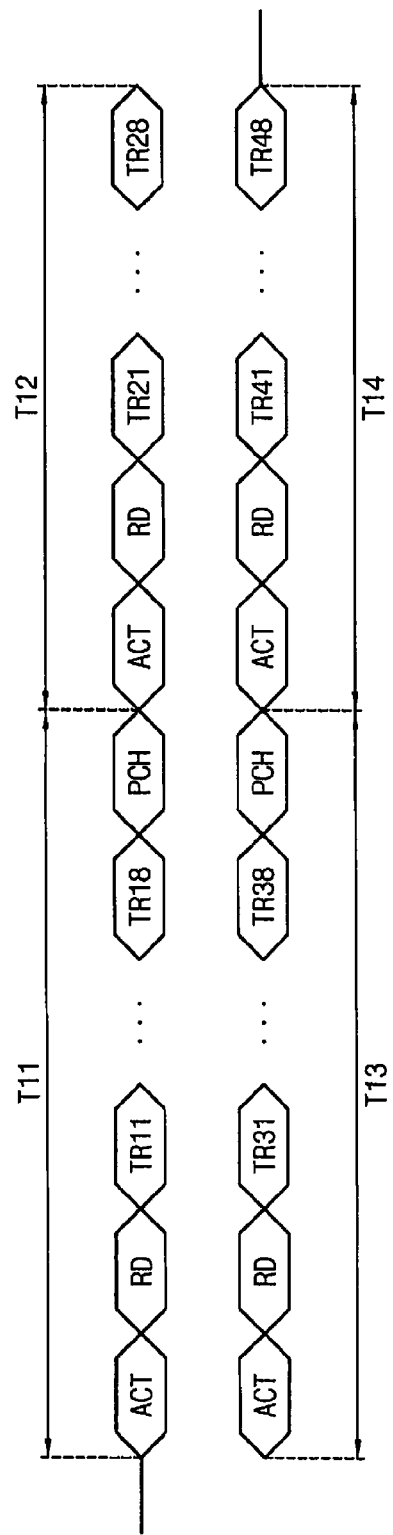
FIG. 19 illustrates that the data are read during the test mode when the semiconductor memory device of FIG. 8 does not include the data control circuit.

FIG. 19 illustrates that the data are read during the test mode when the semiconductor memory device of FIG. 8 does not include the data control circuit.

Referring to FIGS. 8 and 19, during the test mode, the word-line WL1 is enabled in response to an active command ACT, the test result data TR11~TR18 are read from the memory cell row connected to the word-line WL1 in the memory block 311 and are provided to the test device 150 in response to a read command, and bit-lines of the memory cells connected to the word-line WL1 are precharged (PCH) during an interval T11. During an interval T12, the word-line WL2 is enabled in response to an active command ACT, the test result data TR21~TR28 are read from the memory cell row connected to the word-line WL2 in the memory block 311 and are provided to the test device 150 in response to a read command, and bit-lines of the memory cells connected to the word-line WL2 are precharged.

During an interval T13, the word-line WL3 are enabled in response to an active command ACT, the test result data TR31~TR38 are read from the memory cell row connected to the word-line WL3 in the memory block 311 and is provided to the test device 150 in response to a read command, and bit-lines of the memory cells connected to the word-line WL3 are precharged. During an interval T14, the word-line WL4 is enabled in response to an active command ACT, the test result data TR41~TR48 are read from the memory cell row connected to the word-line WL4 in the memory block 311 and are provided to the test device 150 in response to a read command, and bit-lines of the memory cells connected to the word-line WL4 are precharged. The test device 150 compares whether the test result data TR11~TR18, TR21~TR28, TR31~TR38 and TR41~TR48 are same with respect to each other and determines pass/fail of the memory cells in the memory block 311 by the unit of repair.

Figure 20:
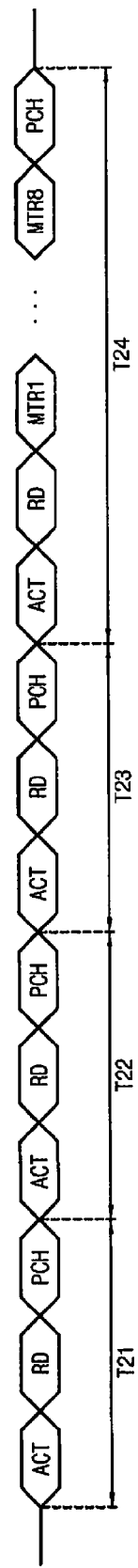
FIG. 20 illustrates that the data are read during the test mode when the semiconductor memory device of FIG. 8 includes the data control circuit.

FIG. 20 illustrates that the data are read during the test mode when the semiconductor memory device of FIG. 8 includes the data control circuit.

Referring to FIGS. 8 and 19, during the test mode, the word-line WL1 is enabled in response to an active command ACT, and the test result data TR11~TR18 are read from the memory cell row connected to the word-line WL1 in the memory block 311 in response to a read command RD, the read test result data TR11~TR18 are latched in the data control circuit 400 and bit-lines of the memory cells connected to the word-line WL1 are precharged during an interval T21. During an interval T22, the word-line WL2 is enabled in response to an active command ACT, and the test result data TR21~TR28 are read from the memory cell row connected to the word-line WL2 in the memory block 311 in response to a read command RD, the read test result data TR21~TR28 are latched in the data control circuit 400 and bit-lines of the memory cells connected to the word-line WL2 are precharged.

During an interval T23, the word-line WL3 is enabled in response to an active command ACT, and the test result data TR31~TR38 are read from the memory cell row connected to the word-line WL3 in the memory block 311 in response to a read command RD, the read test result data TR31~TR38 are latched in the data control circuit 400 and bit-lines of the memory cells connected to the word-line WL3 are precharged. During an interval T24, the word-line WL4 is enabled in response to an active command ACT, and the test result data TR41~TR48 are read from the memory cell row connected to the word-line WL4 in the memory block 311 in response to a read command RD, the read test result data TR41~TR48 are compared with the previous test result data and are latched in the data control circuit 400, are provided to the test device 150 as the merged test results MTR1~MTR8 and bit-lines of the memory cells connected to the word-line WL3 are precharged. The test device 150 determines pass/fail of the memory cells in the memory block 311 by the unit of repair based on logic levels of the merged test results MTR1~MTR8. For example, the test device 150 may compare all bits in the merged test results MTR1~MTR8 generated with respect to memory cells connected to word-lines of a memory block, and the test device 150 may determine a memory block to pass if all MTR values MTR1~MTR8 generated with respect to memory cells of the memory block have a high logic value (i.e., a first logic level).

For example, test result data TR11, TR21, TR31, and TR41 are examples of correspondingly-located bits (i.e., bits that correspond to each other) and are compared to each other to determine whether each of result data TR11, TR21, TR31, and TR41 have the same value as each other, and the merged test result MTR1 is generated based on the result of the comparison, in accordance with FIGS. 8-18 discussed above. Similarly, test result data TR12, TR22, TR32, and TR42 are examples of correspondingly-located bits and are compared to each other to determine whether each of result data TR12, TR22, TR32, and TR42 have the same value as each other, and the merged test result data MTR2 is generated based on the result of the comparison, in accordance with FIGS. 8-18 discussed above. Merged test results MTR3-MTR8 may be generated based on test result data TR13-TR43 TR18-TR48 in the same manner discussed above with respect to merged test results MTR1-MTR2.

Referring to FIGS. 19 and 20, test time for the memory cells by the unit of repair is greatly reduced in FIG. 20 when compared with FIG. 19, because in example of FIG. 19, the test result data TR11~TR18, TR21~TR28, TR31~TR38 and TR41~TR48 are provided to the test device 150 four times while in example of FIG. 20, the merged test results MTR1~MTR8 are provided to the test device 150 only once.

The memory controller 100 may control the control logic circuit 210 based on the merged test results MTR. When bits in correspondingly-located bits are not same with respect to each other, the control logic circuit 210 controls the switching circuits 290 such that a memory block (for example, the memory block 311) storing the correspondingly-located bits is disconnected and the first block is replaced by some or all of the second memory block 314. For example, the test device 150 may determine whether to repair the memory block (for example, the memory block 311) storing the correspondingly-located bits corresponding to the unit of repair using the second memory block 314.

Figure 21:
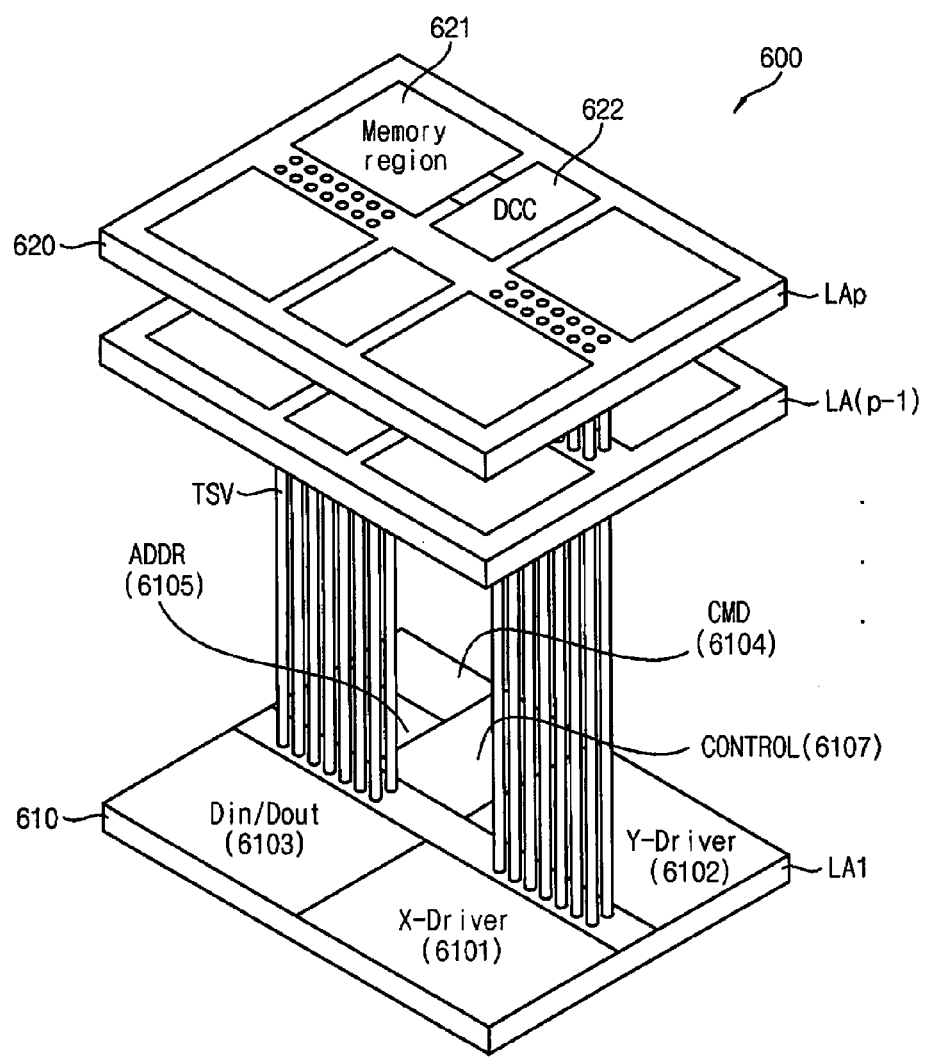
FIG. 21 is a structural diagram illustrating a semiconductor memory device according to at least some example embodiments of the inventive concepts.

FIG. 21 is a structural diagram illustrating a semiconductor memory device according to at least some example embodiments of the inventive concepts.

Figure 23:
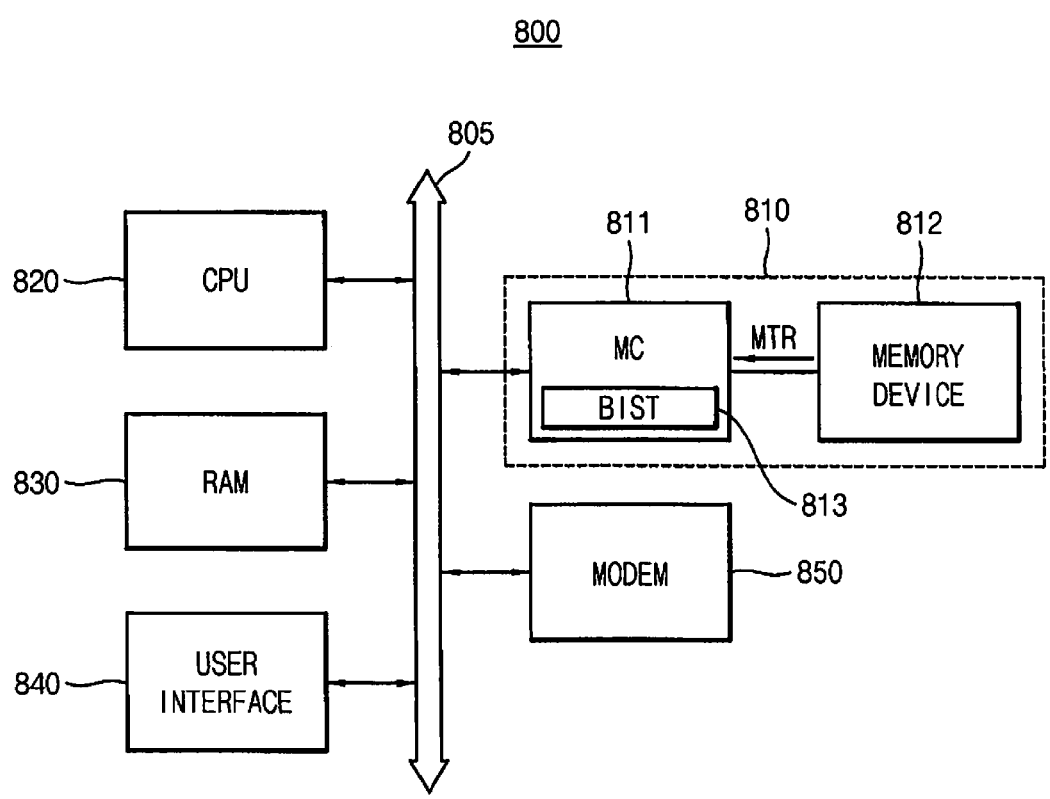
FIG. 23 is a block diagram illustrating a computing system including the semiconductor memory device according to at least some example embodiments of the inventive concepts.

Referring to FIG. 23, a semiconductor memory device 600 may include first through pth semiconductor integrated circuit layers LA1 through Lap (p is an integer greater than 2), in which the lowest first semiconductor integrated circuit layer LA1 is assumed to be an interface or control chip and the other semiconductor integrated circuit layers LA2 through LAp are assumed to be slave chips including core memory chips. The first through kth semiconductor integrated circuit layers LA1 through LAp may transmit and receive signals therebetween through through-silicon-vias (TSVs). The lowest first semiconductor integrated circuit layer LA1 as the interface or control chip may communicate with an external memory controller through a conductive structure formed on an external surface. A description will be made regarding structure and an operation of the semiconductor memory device 600 by mainly using the first semiconductor integrated circuit layer LA1 or 610 as the interface or control chip and the nth semiconductor integrated circuit layer LAp or 620 as the slave chip.

The first semiconductor integrated circuit layer 610 may include various peripheral circuits for driving memory regions 621 provided in the pth semiconductor integrated circuit layer 620. For example, the first semiconductor integrated circuit layer 610 may include a row (X)-driver 6101 for driving word-lines of a memory, a column (Y)-driver 6102 for driving bit-lines of the memory, a data input/output unit (Din/Dout) 6103 for controlling input/output of data, a command buffer (CMD) 6104 for receiving a command CMD from outside and buffering the command CMD, and an address buffer (ADDR) 6105 for receiving an address from outside and buffering the address. The memory region 621 may include a plurality of bank arrays in which a plurality of memory cells are arranged, and each of the plurality of bank arrays may include first memory blocks and a second memory block as described with reference to FIG. 8.

The first semiconductor integrated circuit layer 610 may further include a control logic 6107. The control logic 6107 may access the memory region 621 and may generate control signals for accessing the memory region 621 based on the command from the memory controller.

The pth semiconductor integrated circuit layer 620 may further include a data control circuit 622 that tests the memory cells in the memory region 621 by the unit of repair during the test mode. As described with reference to FIGS. 8 through 20, the data control circuit 622 may sequentially read a first unit of data from N memory cell rows of a plurality of memory cell rows (N is an integer equal to or greater than two), respectively, may generate the merged test results by comparing bits read from the first units of the N memory cell rows and may output the merged test results during the test mode of the semiconductor memory device 600. The merged test results MTR may include result bits each indicating whether correspondingly-located bits in the first units, read from each of corresponding locations in the N memory cell rows have a same value with respect to each other. The memory controller 100 or the test device may determine to repair the N memory cell rows or not based on the merged test results.

Figure 22:
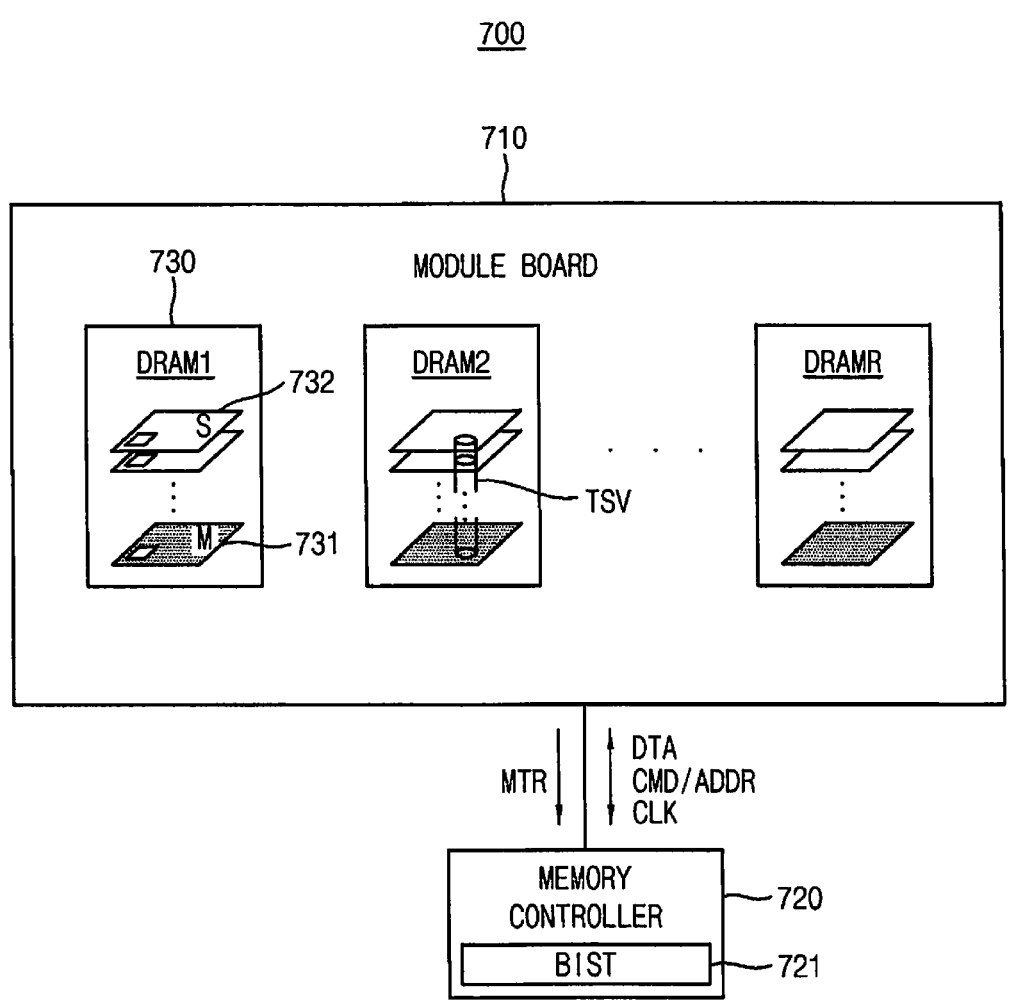
FIG. 22 illustrates a memory system including the semiconductor memory device according to at least some example embodiments of the inventive concepts.

FIG. 22 illustrates a memory system including the semiconductor memory device according to at least some example embodiments of the inventive concepts.

Referring to FIG. 22, a memory system 700 may include a memory module 710 and a memory controller 720. The memory module 710 may include at least one semiconductor memory device 730 mounted on a module board. The semiconductor memory device 730 may employ the semiconductor memory device 200a of FIG. 3. For example, the semiconductor memory device 730 may be constructed as a DRAM chip or a MRAM chip. In addition, the semiconductor memory device 730 may include a stack of semiconductor chips. In this case, the semiconductor chips may include at least one master chip 731 and at least one slave chip 732. Signal transfer between the semiconductor chips may occur via through-silicon vias TSV.

The master chip 731 and the slave chip 732 may employ the semiconductor memory device 200a of FIG. 3. Therefore, the semiconductor memory device may include a data control circuit that tests the memory cells by the unit of repair during the test mode. Therefore, the semiconductor memory device may sequentially read a first unit of data N memory cell rows of a plurality of memory cell rows (N is an integer equal to or greater than two), respectively, may generate the merged test results MTR by comparing bits read from the first units of the N memory cell rows and may output the merged test results MTR during the test mode of the semiconductor memory device 730. The merged test results MTR may include result bits each indicating whether correspondingly-located bits in the first units, read from each of corresponding locations in the N memory cell rows have a same value with respect to each other. The semiconductor memory device may provide the merged test results MTR to a built-in self-test (BIST) circuit 721. The built-in self-test circuit 721 may determine to repair the N memory cell rows or not based on the merged test result data MTR.

The memory module 710 may communicate with the memory controller 720 via a system bus. Data DTA, a command/address CMD/ADDR, and a clock signal CLK may be transmitted and received between the memory module 710 and the memory controller 720 via the system bus.

In addition, in an embodiment of the present inventive concept, a three dimensional (3D) memory array is provided in semiconductor memory device 730. The 3D memory array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array. The following patent documents, which are hereby incorporated by reference, describe suitable configurations for the 3D memory arrays, in which the three-dimensional memory array is configured as a plurality of levels, with word-lines and/or bit-lines shared between levels: U.S. Pat. Nos. 7,679,133; 8,553,466; 8,654,587; 8,559,235; and US Pat. Pub. No. 2011/0233648.

FIG. 23 is a block diagram illustrating a computing system including the semiconductor memory device according to at least some example embodiments of the inventive concepts.

Referring to FIG. 23, a computing system 800 may be mounted on a mobile device or a desktop computer. The computing system 800 may include a memory system 810, a central processing unit (CPU) 820, a RAM 830, a user interface 840, and a modem 850 such as a baseband chipset, which are electrically connected to a system bus 805. The computing system 800 may further include an application chipset, a camera image processor (CIS), and an input/output device.

The user interface 840 may be an interface for transmitting data to a communication network or receiving data from the communication network. The user interface 840 may have a wired or wireless form, and may include an antenna or a wired/wireless transceiver. Data applied through the user interface 840 or the modem 850 or processed by the CPU 820 may be stored in the memory system 810.

The memory system 810 includes a semiconductor memory device 812 such as DRAM and a memory controller 811. The memory controller 811 may include a built-in self-test (BIST) circuit 813. Data processed by the CPU 820 or external data is stored in the semiconductor memory device 812. The semiconductor memory device 812 may employ the semiconductor memory device 200*a* of FIG. 3. Therefore, the semiconductor memory device 812 may include a data control circuit that tests the memory cells by the unit of repair during the test mode. Therefore, the semiconductor memory device 812 may sequentially read a first unit of data from N memory cell rows of the plurality of memory cell rows (N is an integer equal to or greater than two), respectively, may generate the merged test results MTR by comparing bits read from the first units of the N memory cell rows and may output the merged test results MTR during the test mode of the semiconductor memory device 812. The merged test results MTR may include result bits each indicating whether correspondingly-located bits in the first units, read from each of corresponding locations in the N memory cell rows have a same value with respect to each other. The semiconductor memory device 812 may provide the merged test result data MTR to the built-in self-test circuit 813. The built-in self-test circuit 813 may determine to repair the N memory cell rows or not based on the merged test result data MTR.

When the computing system 800 is a device that performs wireless communications, the computing system 800 may be used in a communication system such as code division multiple access (CDMA), global system for mobile communication (GSM), North American multiple access (NADC), or CDMA2000. The computing system 800 may be mounted on an information processing device such as a personal digital assistant (PDA), a portable computer, a web tablet, a digital camera, a portable media player (PMP), a mobile phone, a wireless phone, or a laptop computer.

Figure 24:
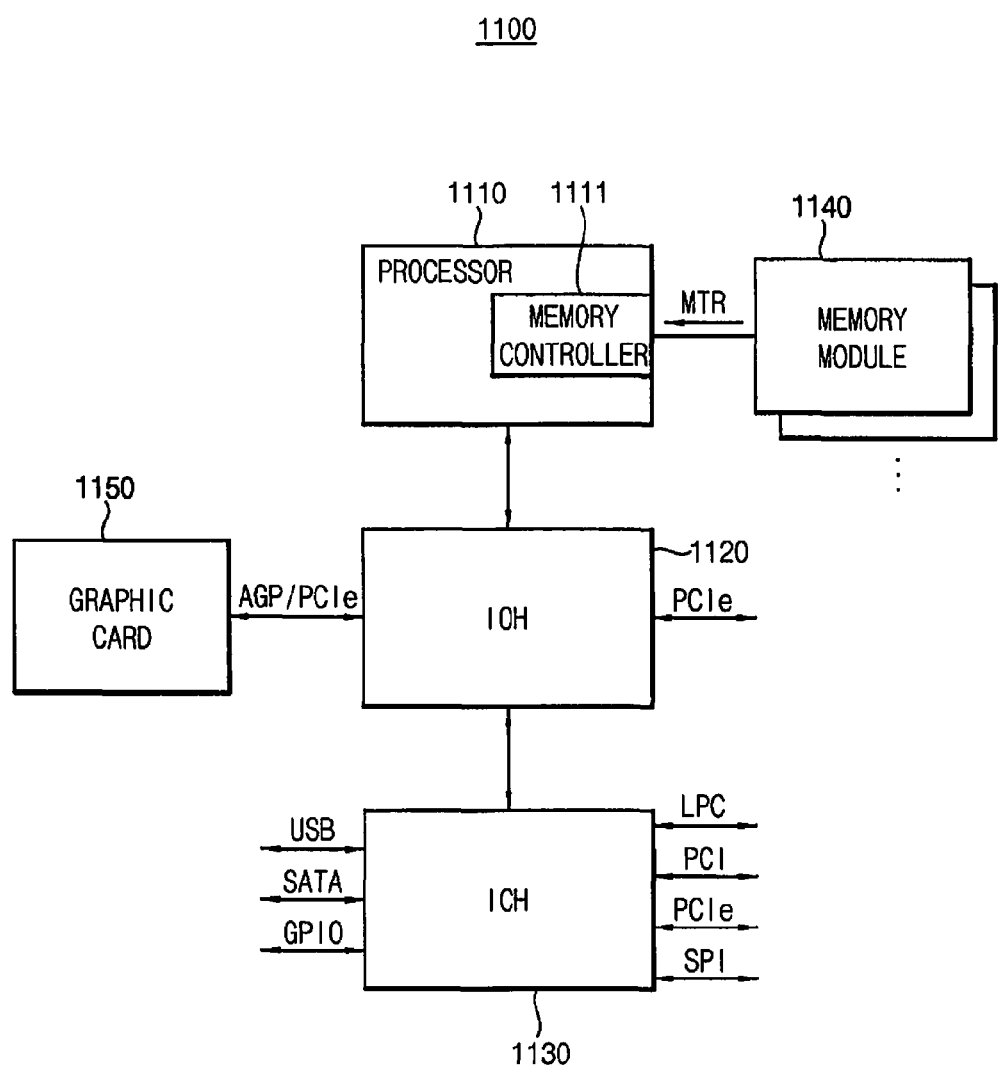
FIG. 24 is a block diagram illustrating a computing system including the semiconductor memory device according to at least some example embodiments of the inventive concepts.

FIG. 24 is a block diagram illustrating a computing system including the semiconductor memory device according to at least some example embodiments of the inventive concepts.

Referring to FIG. 24, a computing system 1100 may include a processor 1110, an input/output hub (IOH) 1120, an input/output controller hub (ICH) 1130, at least one memory module 1140 and a graphics card 1150. According to at least some example embodiments of the inventive concepts, the computing system 1100 may be a personal computer (PC), a server computer, a workstation, a laptop computer, a mobile phone, a smart phone, a personal digital assistant (PDA), a portable multimedia player (PMP), a digital camera, a digital television, a set-top box, a music player, a portable game console, a navigation system, etc.

The processor 1110 may perform various computing functions, such as executing specific software for performing specific calculations or tasks. For example, the processor 1110 may be a microprocessor, a central process unit (CPU), a digital signal processor, or the like. According to at least some example embodiments of the inventive concepts, the processor 1110 may include a single core or multiple cores. For example, the processor 1110 may be a multi-core processor, such as a dual-core processor, a quad-core processor, a hexa-core processor, etc. Although FIG. 21 illustrates the computing system 1100 including one processor 1110, According to at least some example embodiments of the inventive concepts, the computing system 1100 may include a plurality of processors. The processor 1110 may include an internal or external cache memory.

The processor 1110 may include a memory controller 1111 for controlling operations of the memory module 1140. The memory controller 1111 included in the processor 1110 may be referred to as an integrated memory controller (IMC). A memory interface between the memory controller 1111 and the memory module 1140 may be implemented with a single channel including a plurality of signal lines, or may be implemented with multiple channels, to each of which at least one memory module 1140 may be coupled. According to at least some example embodiments of the inventive concepts, the memory controller 1111 may be located inside the input/output hub 1120, which may be referred to as a memory controller hub (MCH).

The memory module 1140 may include a plurality of semiconductor memory devices that store data provided from the memory controller 1111. Each of the plurality of semiconductor memory devices may employ the semiconductor memory device 200*a* of FIG. 3. Therefore, each of the semiconductor memory devices may include a data control circuit that tests the memory cells by the unit of repair during the test mode. Therefore, each of the semiconductor memory devices may sequentially read a first unit of data from N memory cell rows of the plurality of memory cell rows (N is an integer equal to or greater than two), respectively, may generate the merged test results MTR by comparing bits read from the first units of the N memory cell rows and may output the merged test results MTR during the test mode.

The merged test results MTR may include result bits each indicating whether correspondingly-located bits in the first units, read from each of corresponding locations in the N memory cell rows have a same value with respect to each other. Each of the semiconductor memory devices may provide the merged test result data MTR to the memory controller 1111. The memory controller 1111 may determine to repair the N memory cell rows or not based on the merged test result data MTR.

The input/output hub 1120 may manage data transfer between the processor 1110 and devices, such as the graphics card 1150. The input/output hub 1120 may be coupled to the processor 1110 via various interfaces. For example, the interface between the processor 1110 and the input/output hub 1120 may be a front side bus (FSB), a system bus, a HyperTransport, a lightning data transport (LDT), a Quick-Path interconnect (QPI), a common system interface (CSI), etc. Although FIG. 21 illustrates the computing system 1100 including one input/output hub 1120, According to at least some example embodiments of the inventive concepts, the computing system 1100 may include a plurality of input/output hubs. The input/output hub 1120 may provide various interfaces with the devices. For example, the input/output hub 1120 may provide an accelerated graphics port (AGP) interface, a peripheral component interface-express (PCIe), a communications streaming architecture (CSA) interface, etc.

The graphics card 1150 may be coupled to the input/output hub 1120 via AGP or PCIe. The graphics card 1150 may control a display device (not shown) for displaying an image. The graphics card 1150 may include an internal processor for processing image data and an internal semiconductor memory device. According to at least some example embodiments of the inventive concepts, the input/output hub 1120 may include an internal graphics device along with or instead of the graphics card 1150 outside the input/output hub 1120. The graphics device included in the input/output hub 1120 may be referred to as integrated graphics. Further, the input/output hub 1120 including the internal memory controller and the internal graphics device may be referred to as a graphics and memory controller hub (GMCH).

The input/output controller hub 1130 may perform data buffering and interface arbitration in order to efficiently operate various system interfaces. The input/output controller hub 1130 may be coupled to the input/output hub 1120 via an internal bus, such as a direct media interface (DMI), a hub interface, an enterprise Southbridge interface (ESI), PCIe, etc. The input/output controller hub 1130 may provide various interfaces with peripheral devices. For example, the input/output controller hub 1130 may provide a universal serial bus (USB) port, a serial advanced technology attachment (SATA) port, a general purpose input/output (GPIO), a low pin count (LPC) bus, a serial peripheral interface (SPI), PCI, PCIe, etc.

According to at least some example embodiments of the inventive concepts, the processor 1110, the input/output hub 1120 and the input/output controller hub 1130 may be implemented as separate chipsets or separate integrated circuits. In other embodiments, at least two of the processor 1110, the input/output hub 1120 and the input/output controller hub 1130 may be implemented as a single chipset.

At least some example embodiments of the inventive concepts may be applied to systems using semiconductor memory devices. At least some example embodiments of the inventive concepts may be applied to systems such as be a mobile phone, a smart phone, a personal digital assistant (PDA), a portable multimedia player (PMP), a digital camera, a camcorder, personal computer (PC), a server computer, a workstation, a laptop computer, a digital TV, a set-top box, a portable game console, a navigation system, etc.

Example embodiments of the inventive concepts having thus been described, it will be obvious that the same may be varied in many ways. Such variations are not to be regarded as a departure from the intended spirit and scope of example embodiments of the inventive concepts, and all such modifications as would be obvious to one skilled in the art are intended to be included within the scope of the following claims.

What is claimed is:

1. A semiconductor memory device comprising:
   a memory cell array including a plurality of word-lines and plurality of memory cell rows connected to the plurality of word-lines, respectively; and
   a data control circuit configured to,
      sequentially read a first unit of data from each of N memory cell rows of the plurality of memory cell rows, wherein N is an integer equal to or greater than two,
      generate merged test results by comparing bits from the first unit of data read from a first memory cell row of the N memory cell rows to bits from at least the first unit of data read from a second memory cell row of the N memory cell rows, and
      output the merged test results during a test mode of the semiconductor memory device,
   the N memory cell rows corresponding to a unit of repair of the semiconductor memory device.

2. The semiconductor memory device of claim 1, wherein each of the first units of data corresponds to data of a burst length of the semiconductor memory device, and
   the merged test results include result bits each indicating whether correspondingly-located bits in the first units of data, read from each of corresponding locations in the N memory cell rows, have a same value with respect to each other.

3. The semiconductor memory device of claim 2, wherein the data control circuit comprises a plurality of unit control circuits, and
   each of the unit control circuits is configured to,
      sequentially compare correspondingly-located bits in the first units of data, read from each of corresponding locations in the N memory cell rows,
      selectively latch a comparison result according to the comparison result, and
      output each of the result bits of the merged test results.

4. The semiconductor memory device of claim 3, wherein each of the plurality of unit control circuits comprises:
   a path selector configured to provide data read from each of the N memory cell rows to a first path during a normal mode of the semiconductor memory device and configured to provide the correspondingly-located bits to a second path during the test mode, in response to a mode signal; and
   a data accumulator configured to sequentially compare the correspondingly-located bits, configured to selectively latch the comparison result, and configured to output each of the result bits of the merged test results in response to at least a reset signal during the test mode, and
   wherein the data accumulator is reset in response to the reset signal whenever the data accumulator outputs a last result bit of the merged test results for each correspondingly-located bits.

5. The semiconductor memory device of claim 4, wherein the data control circuit is configured to write test pattern data with a first logic level in the plurality of memory cell rows during the test mode, and wherein the data accumulator comprises:
 a comparator configured to sequentially compare the correspondingly-located bits in response to at least the reset signal;
 a latch circuit connected to the comparator at a first node, the latch circuit configured to latch an output of the comparator; and
 a first inverter configured to invert an output of the latch circuit to output a corresponding result bit of the merged test results.

6. The semiconductor memory device of claim 5, wherein the latch circuit is configured to output the output of the comparator as the first logic level when the reset signal has a second logic level different from the first logic level and the correspondingly-located bit has the first logic level.

7. The semiconductor memory device of claim 5, wherein the comparator comprises:
 a p-channel metal-oxide semiconductor (PMOS) transistor connected between a power supply voltage and the first node;
 a first n-channel metal-oxide semiconductor (NMOS) transistor connected to the PMOS transistor at the first node; and
 a second NMOS transistor connected between the first NMOS transistor and a ground voltage, and
 wherein the comparator is configured such that the correspondingly-located bits are sequentially received at gates of the PMOS transistor and the first NMOS transistor, and the reset signal is applied to a gate of the second NMOS transistor.

8. The semiconductor memory device of claim 5, wherein the latch circuit comprises:
 an n-channel metal-oxide semiconductor (NMOS) transistor connected between the first node and a ground voltage; and
 a second inverter connected between the first node and a gate of the NMOS transistor.

9. The semiconductor memory device of claim 4, wherein the data control circuit is configured to write test pattern data with a first logic level in the plurality of memory cell rows during the test mode, and wherein the data accumulator comprises:
 a NAND gate configured to sequentially receive the correspondingly-located bits as a first input;
 a latch circuit configured to latch an output of the NAND gate;
 an inverter configured to invert an output of the latch circuit to output a corresponding result bit of the merged test results; and
 a switch configured to provide one of an output of the inverter and a power supply voltage as a second input to the NAND gate, in response to the reset signal.

10. The semiconductor memory device of claim 9, wherein the inverter is configured to output the corresponding result bit of the merged test results as a second logic level when at least one of the correspondingly-located bit and the output of the latch circuit has the second logic level different from the first logic level.

11. The semiconductor memory device of claim 4, wherein the memory cell array includes a plurality of first memory blocks and a second memory block,
 wherein the memory cell rows are arranged in the first memory blocks and the second memory block,
 wherein the semiconductor memory device further comprises:
  a control logic circuit configured to control access to the memory cell array in response to a command;
  an address register configured to generate the reset signal in response to an access address; and
  a plurality of switching circuits coupled to a plurality of first memory cells in the first memory blocks through first bit-lines and coupled to a plurality of second memory cells in the second memory block through second bit-lines, and
 wherein the memory cell array is a three-dimensional memory cell array.

12. The semiconductor memory device of claim 11, wherein the control logic circuit is configured such that, when correspondingly-located bits in the first units, read from each of corresponding locations in the N memory cell rows are not same with respect to each other, the control logic circuit controls the plurality of switching circuits such that a first block storing correspondingly-located bits of the first memory blocks is disconnected and the first block is replaced by a second block of the second memory block.

13. A memory system comprising:
 a semiconductor memory device; and
 a test device configured to test the semiconductor memory device,
 wherein the semiconductor memory device includes,
  a memory cell array including a plurality of word-lines and a plurality of memory cell rows connected to the plurality of word-lines, respectively, and
  a data control circuit configured to,
   sequentially read a first unit of data from each of N memory cell rows of the plurality of memory cell rows, wherein N is an integer equal to or greater than two,
   generate merged test results by comparing bits from the first unit of data read from a first memory cell row of the N memory cell rows to bits from at least the first unit of data read from a second memory cell row of the N memory cell rows, and
   output, to the test device, the merged test results during a test mode of the semiconductor memory device,
 wherein the N memory cell rows correspond to a unit of repair of the semiconductor memory device.

14. The memory system of claim 13, wherein,
 the first units of data are test pattern data that are provided from the test device and are written in the memory cell array,
 each of the first units of data corresponds to data of a burst length of the semiconductor memory device,
 the merged test results include result bits each indicating whether correspondingly-located bits in the first units, read from each of corresponding locations in the N memory cell rows have a same value with respect to each other, and
 the test device determines to perform repair operation on the semiconductor memory device by the unit of repair, based on the merged test results.

15. The memory system of claim 14, wherein the test device is configured to control the semiconductor memory device such that memory cells of the unit of repair are repaired, when the result bits in the merged test results are not same with respect to each other.

16. A semiconductor memory device comprising:
a memory cell array including a plurality of memory cells connected to a plurality of word-lines, the plurality of word-lines including at least first and second word-lines; and
a data control circuit configured to,
read a first set of bits from first memory cells connected to the first word-line,
read a second set of bits from second memory cells connected to the second word-line, locations of the first memory cells with respect to the first word-line corresponding, respectively, with locations of the second memory cells with respect to the second word-line, such that the first set of bits correspond, respectively, with the second set of bits,
perform a comparison operation by determining if values of the first set of bits match corresponding ones of the second set of bits, and
generate merged test results based on results of the comparison operation; and
a memory controller configured to determine whether or not to repair a unit of memory cells including the first and second memory cells based on the merged test results.

17. The semiconductor memory device of claim 16, wherein,
the plurality of word-lines includes third and fourth word-lines,
the data control circuit is further configured to,
read a third set of bits from third memory cells connected to the third word-line,
read a fourth set of bits from fourth memory cells connected to the fourth word-line, locations of the first memory cells with respect to the first word-line, locations of the second memory cells with respect to the second word-line, locations of the third memory cells with respect to the third word-line, and locations of the fourth memory cells with respect to the fourth word-line corresponding, respectively, to each other such that the first set of bits, second set of bits, third set of bits, and fourth set of bits correspond, respectively, to each other, and
perform the comparison operation such that the comparison operation includes determining if values of the first set of bits match corresponding ones of the second set of bits, the third set of bits, and the fourth set of bits, and
the memory controller is configured to determine whether or not to replace a unit of memory cells including the first, second, third and fourth memory cells based on the merged test results.

\* \* \* \* \*